US012471344B2

(12) United States Patent
Lin et al.

(10) Patent No.: US 12,471,344 B2
(45) Date of Patent: Nov. 11, 2025

(54) DRY ETCHING OF SEMICONDUCTOR STRUCTURES WITH FLUORINE-CONTAINING GASES

(71) Applicant: Taiwan Semiconductor Manufacturing Company, Ltd., Hsinchu (TW)

(72) Inventors: Tze-Chung Lin, Hsinchu (TW); Han-Yu Lin, Nantou County (TW); Fang-Wei Lee, Hsinchu (TW); Li-Te Lin, Hsinchu (TW); Pinyen Lin, Rochester, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 846 days.

(21) Appl. No.: 17/461,186

(22) Filed: Aug. 30, 2021

(65) Prior Publication Data

US 2023/0064393 A1 Mar. 2, 2023

(51) Int. Cl.
*H10D 64/01* (2025.01)
*H01L 21/3065* (2006.01)
*H10D 30/01* (2025.01)
*H10D 30/67* (2025.01)
*H10D 62/10* (2025.01)

(52) U.S. Cl.
CPC ....... *H10D 64/017* (2025.01); *H01L 21/3065* (2013.01); *H10D 30/031* (2025.01); *H10D 30/6757* (2025.01); *H10D 62/116* (2025.01); *H10D 64/018* (2025.01); *H10D 30/6735* (2025.01)

(58) Field of Classification Search
CPC .......... H01L 29/66545; H01L 21/3065; H01L 29/0653; H01L 29/66553; H01L 29/66742; H01L 29/78696; H01L 29/42392; H01L 29/0673; H01L 21/30604; H01L 29/66439; H01L 29/775; H01L 29/66795; H01L 29/0642; H01L 29/0684; H01L 29/66484; H01L 29/6653; H01L 29/7855; B82Y 10/00
USPC ....................................................... 257/401
See application file for complete search history.

(56) References Cited

U.S. PATENT DOCUMENTS

| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |

(Continued)

FOREIGN PATENT DOCUMENTS

JP 2003077888 A * 3/2003

*Primary Examiner* — Mohammad M Hoque
(74) *Attorney, Agent, or Firm* — Sterne, Kessler, Goldstein & Fox P.L.L.C

(57) ABSTRACT

The present disclosure describes a method that includes forming a fin structure with a stacked fin portion on a substrate. The stacked fin portion includes a first semiconductor layer and a second semiconductor layer, in which the second semiconductor layer includes germanium. The method further includes etching the fin structure to form an opening and etching a portion of the second semiconductor layer with a fluorine-containing gas through the opening.

20 Claims, 21 Drawing Sheets

(56) References Cited

U.S. PATENT DOCUMENTS

| | | |
|---|---|---|
| 9,576,814 B2 | 2/2017 | Wu et al. |
| 9,601,342 B2 | 3/2017 | Lee et al. |
| 9,608,116 B2 | 3/2017 | Ching et al. |
| 2009/0008705 A1* | 1/2009 | Zhu ........................ H10D 30/62 |
| | | 257/E21.409 |
| 2014/0151639 A1* | 6/2014 | Chang ................. H01L 29/0673 |
| | | 257/27 |
| 2017/0194430 A1* | 7/2017 | Wood .................. H01L 29/0673 |
| 2017/0207317 A1* | 7/2017 | Posseme ............. H01L 29/6653 |
| 2019/0198645 A1* | 6/2019 | Cheng ............... H01L 29/66742 |
| 2020/0006577 A1* | 1/2020 | Ching ................. H01L 21/0262 |
| 2020/0098575 A1* | 3/2020 | Takahashi ........... H01L 21/0262 |
| 2020/0273964 A1* | 8/2020 | Lin ....................... H01L 29/785 |
| 2021/0296184 A1* | 9/2021 | Xie ..................... H01L 21/8221 |

* cited by examiner

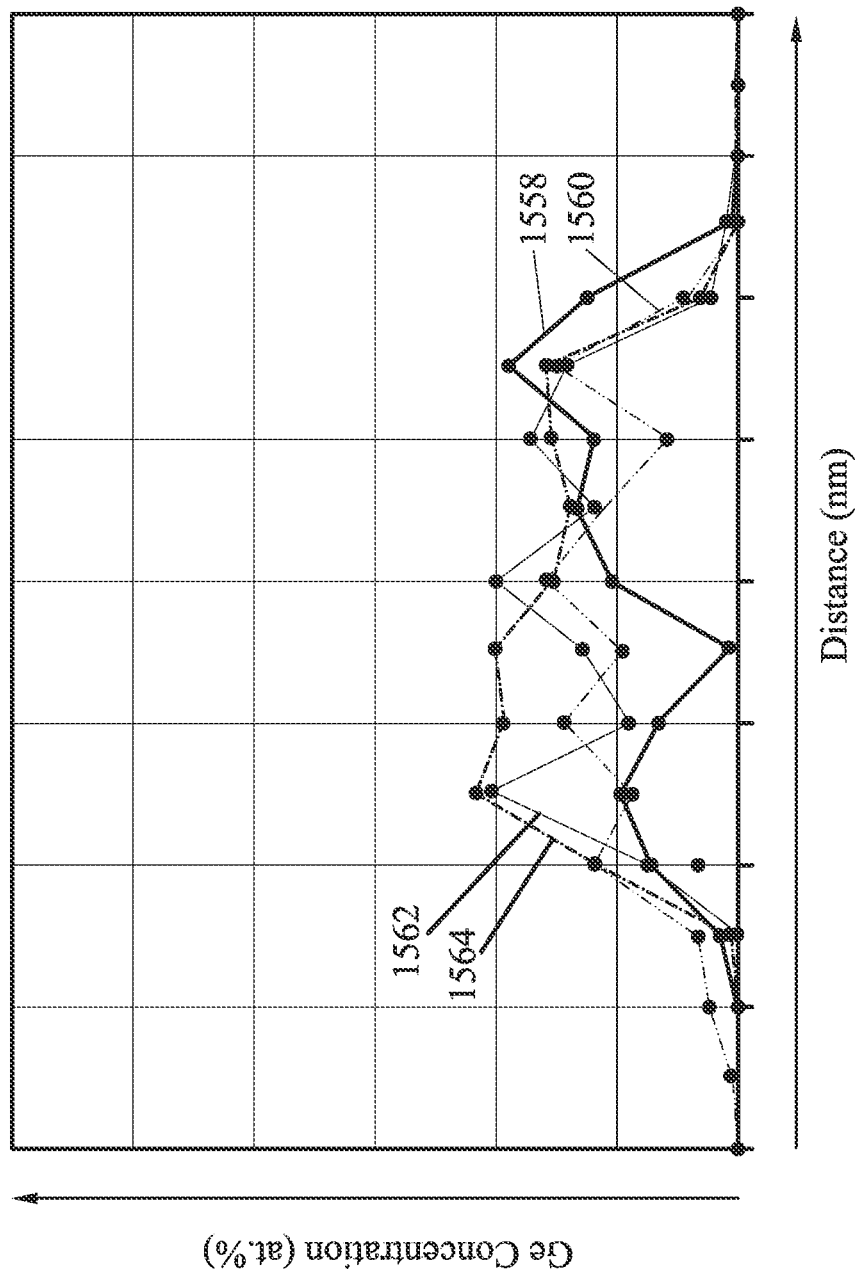

DRY ETCHING OF SEMICONDUCTOR STRUCTURES WITH FLUORINE-CONTAINING GASES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIGS. 15A and 15B illustrate germanium distributions along an interface between an inner spacer structure and a semiconductor layer etched with a fluorine-containing gas, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
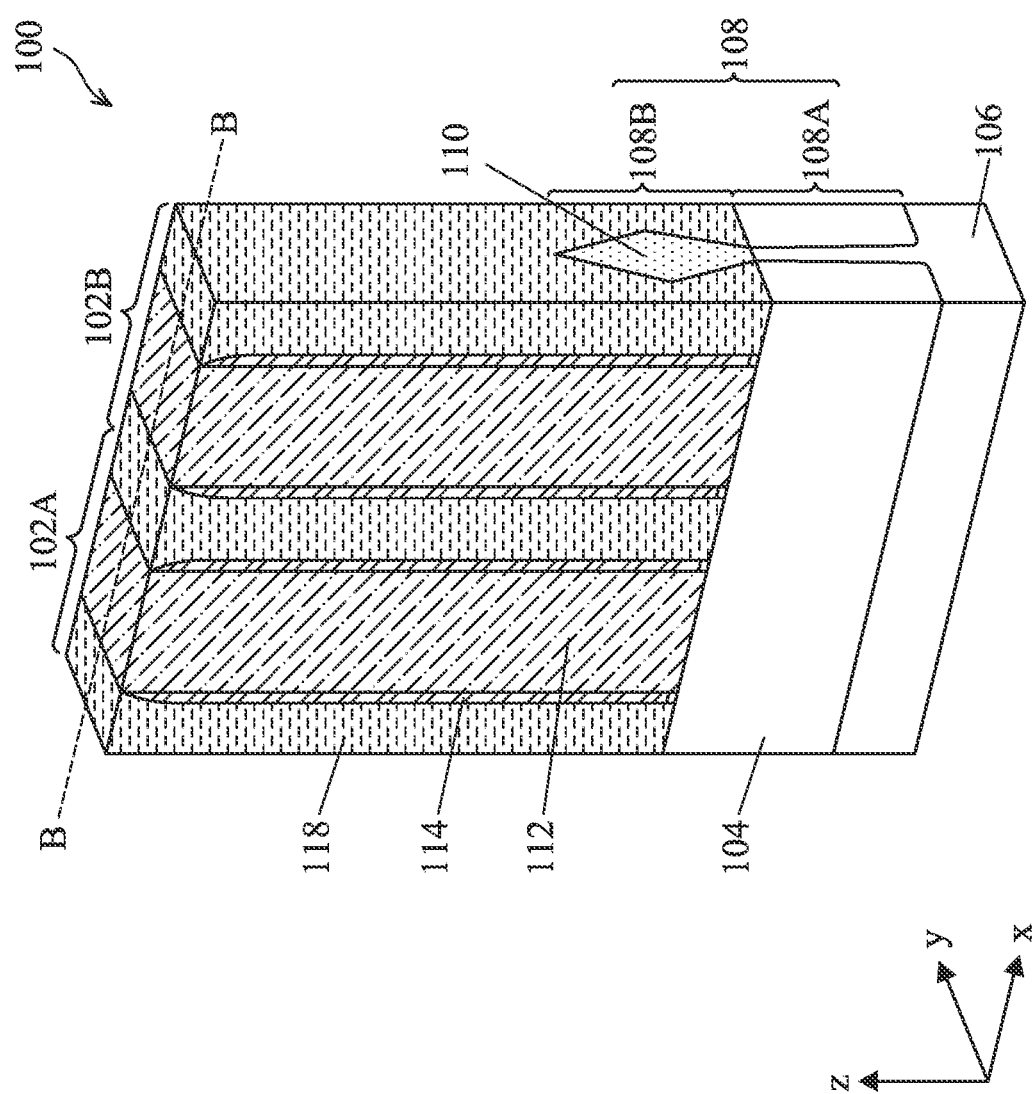
FIGS. 1-4 illustrate an isometric view, partial cross-sectional views, and a planar view of a semiconductor device formed by a dry etching process with a fluorine-containing gas, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With advances in semiconductor technology, multi-gate devices have been introduced in an effort to improve gate control by increasing gate-channel coupling, reducing off-state current, and reducing short-channel effects (SCEs). One such multi-gate device is the gate-all-around fin field effect transistor (GAA finFET), which provides a channel in a stacked nanosheet/nanowire configuration. The GAA finFET device derives its name from the gate structure that can extend around the channel and provide gate control of the channel on multiple sides of the channel. GAA finFET devices are compatible with MOSFET manufacturing processes and their structure allows them to be scaled while maintaining gate control and mitigating SCEs.

With increasing demand for lower power consumption, higher performance, and smaller area (collectively referred to as "PPA") of semiconductor devices, GAA finFET devices can have their challenges. For example, wet etching of nanosheets/nanowires containing germanium (e.g., SiGe or Ge) can include digital oxidation of the nanosheets/nanowires containing Ge and etching of the oxidized nanosheets/nanowires. During the digital oxidation of the nanosheets/nanowires, oxygen can have a diffusion limit to reach corners of the nanosheets/nanowires. The corners of the nanosheets/nanowires may not be oxidized and may not be removed after the wet etching process. As a result, the wet etching process can form openings with rounded corners in the nanosheets/nanowires and the effective thickness of inner spacer structures formed in the openings can be thinner, which can increase epitaxial structure defects (e.g., damaged epitaxial structures and voids in epitaxial structures) during the formation of nanosheets/nanowires and thus decreasing the process yield.

Embodiments in the present disclosure provide methods for forming a semiconductor device by a dry etching process with a fluorine-containing (F-containing) gas. In some embodiments, the F-containing gas can include fluorine ($F_2$), hydrogen fluoride (HF), chlorine trifluoride ($ClF_3$), fluorine radical (F*), and nitrogen trifluoride radical ($NF_3$*). The example methods in the present disclosure can form a fin structure including a fin bottom portion and a stacked fin portion on a substrate. The stacked fin portion can include a first set of semiconductor layers and a second set of semiconductor layers. The second set of semiconductor layers can include germanium (Ge). The F-containing gas can etch a portion of the second set of semiconductor layers to form openings in the second set of semiconductor layers. In some embodiments, the F-containing gas in the dry etching process can etch corners of the first portion of the second set of semiconductor layers. As a result, the openings can have a square profile. Inner spacer structures can be formed in the openings with an improved profile and increased effective thickness. The inner spacer structures can include (i) a first portion having a first height adjacent to end portions of the first set of semiconductor layers and (ii) a second portion adjacent to gate structures having a second height greater than the first height. The first portion of the inner spacer structures can have a first width and the second portion can have a second width. A ratio of the first width to a sum of the first width and the second width can be less than about 0.05. In some embodiments, using the dry etching process with the fluorine-containing gas to remove the first portion of the second set of semiconductor layers, epitaxial structure defects can be reduced from about 30-50% to a level below about 10% and the process yield can be improved by about 10% to about 30%.

Figure 2:
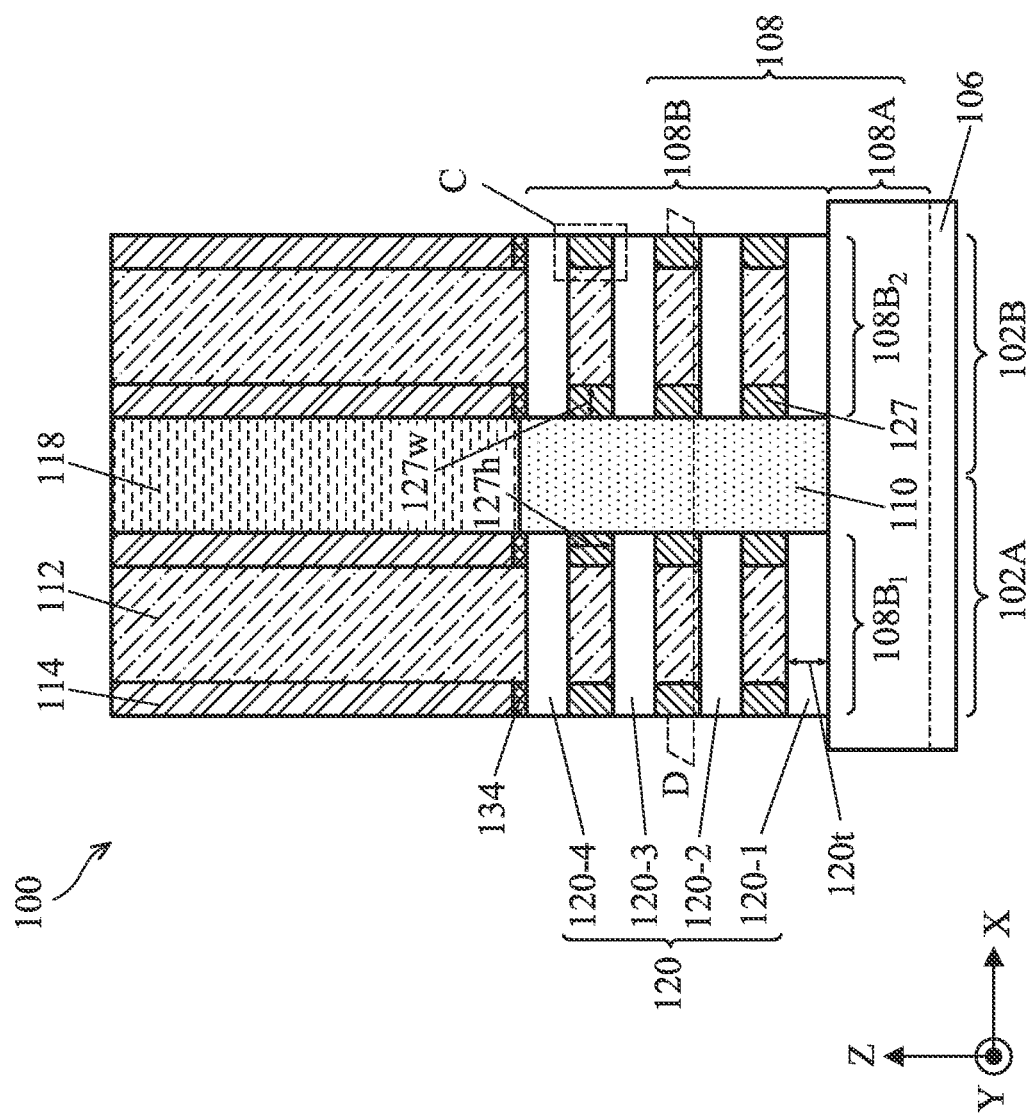
Figure 3:
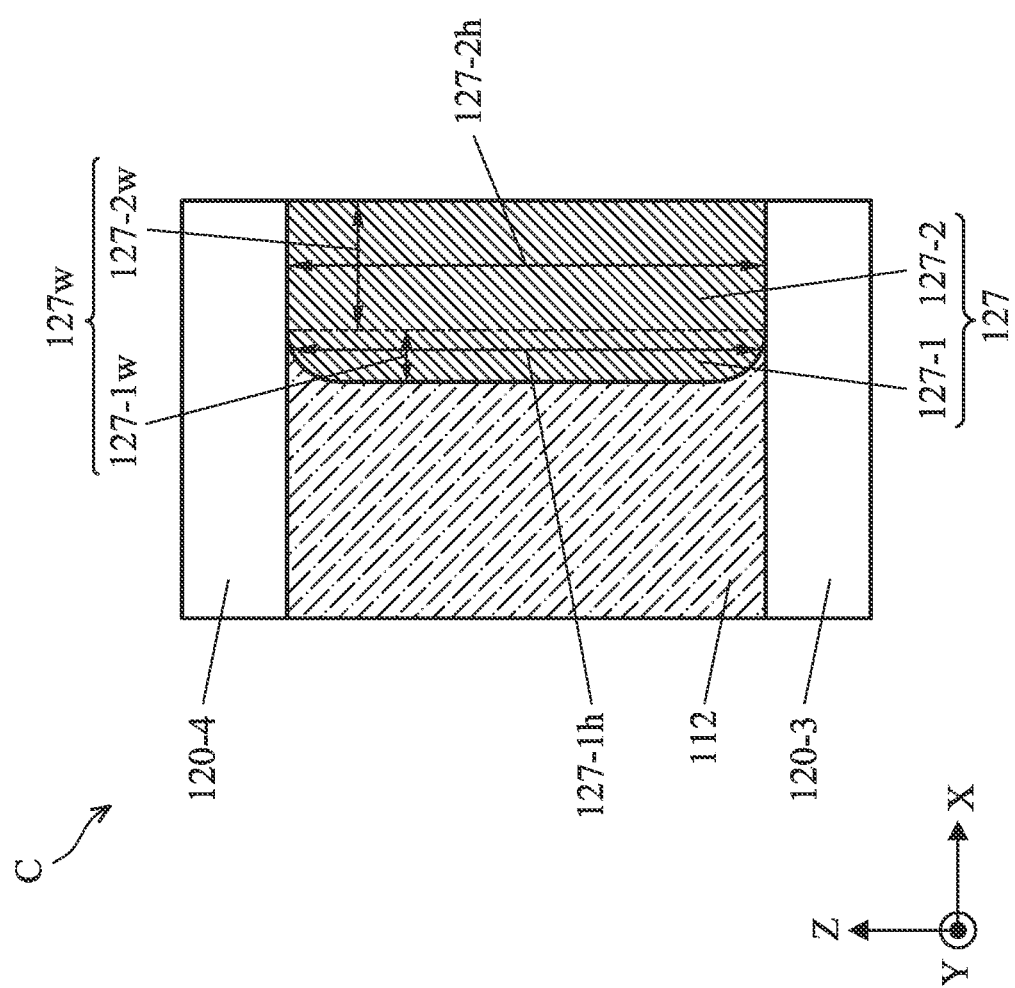
Figure 4:
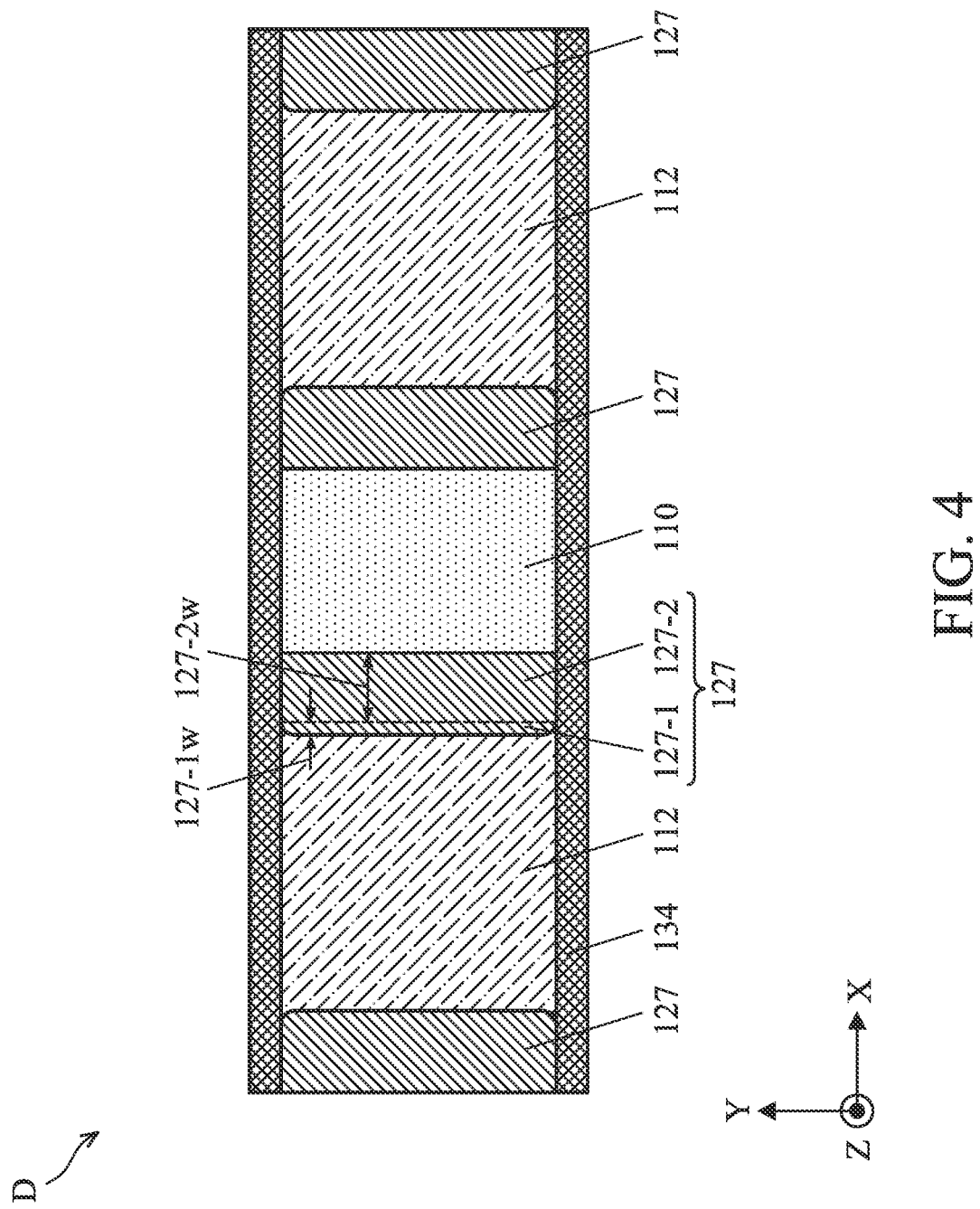

A semiconductor device 100 having finFETs 102A-102B is described with reference to FIGS. 1-4, according to some embodiments. FIG. 1 illustrates an isometric view of semiconductor device 100 formed by a dry etching process with a fluorine-containing gas, according to some embodiments. FIG. 2 illustrates a partial cross-sectional view along line B-B of semiconductor device 100 as shown FIG. 1, according to some embodiments. FIG. 3 illustrates a zoomed-in area C of the partial cross-sectional view of semiconductor device 100 as shown in FIG. 2. FIG. 4 illustrates a planar view across plane D of semiconductor device 100 as shown in FIG. 2, according to some embodiments.

In some embodiments, finFETs 102A-102B can be both p-type finFETs (PFETs), both n-type finFETs (NFETS), or one of each conductivity type finFET (one PFET and one NFET). Though FIGS. 1-4 show two GAA finFETs, semiconductor device 100 can have any number of GAA finFETs. In addition, semiconductor device 100 can be incorporated into an integrated circuit (IC) through the use of other structural components, such as contacts, conductive vias, conductive lines, dielectric layers, passivation layers, and interconnects, that are not shown for simplicity. The discussion of elements of finFETs 102A-102B with the same annotations applies to each other, unless mentioned otherwise.

Referring to FIGS. 1 and 2, finFETs 102A-102B can be formed on a substrate 106. Substrate 106 can include a semiconductor material, such as silicon (Si). In some embodiments, substrate 106 can include a crystalline silicon substrate (e.g., wafer). In some embodiments, substrate 106 can include (i) an elementary semiconductor, such as germanium (Ge); (ii) a compound semiconductor, such as silicon carbide (SiC); (iii) an alloy semiconductor, such as silicon germanium (SiGe); (iv) a silicon-on-insulator (SOI) structure; (v) a silicon germanium (SiGe)-on-insulator structure (SiGeOI); (vi) germanium-on-insulator (GeOI) structure; and (vii) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Referring to FIGS. 1 and 2, finFETs 102A-102B can further include STI regions 104, a fin structure 108, gate structures 112, and gate spacers 114. STI regions 104 can provide electrical isolation between finFET 102A and finFET 102B from each other and from neighboring finFETs with different fin structures (not shown) on substrate 106 and/or neighboring active and passive elements (not shown) integrated with or deposited on substrate 106. STI regions 104 can be made of a dielectric material. In some embodiments, STI regions 104 can include silicon oxide, silicon nitride, silicon oxynitride, fluorine-doped silicate glass (FSG), a low-k dielectric material, and/or other suitable insulating materials. In some embodiments, STI regions 104 can include a multi-layered structure.

Fin structure 108 can extend along an X-axis and through finFETs 102A-102B. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Fin structure 108 can include a fin bottom portion 108A and a fin top portion 108B disposed on fin bottom portion 108A. In some embodiments, fin bottom portion 108A can include material similar to substrate 106. Fin bottom portion 108A can be formed from a photolithographic patterning and an etching of substrate 106. In some embodiments, fin top portion 108B can include stacked fin portions 108B₁ and 108B₂, and epitaxial fin structures 110. Each of stacked fin portions 108B₁ and 108B₂ can be formed on fin bottom portion 108A and can include a stack of semiconductor layers 120-1, 120-2, 120-3, and 120-4 (collectively referred to as "semiconductor layers 120"), which can be in the form of nanosheets or nanowires. Each of semiconductor layers 120 can form a channel region underlying gate structures 112 of finFETs 102A-102B. In some embodiments, semiconductor layers 120 can include semiconductor materials similar to or different from substrate 106. In some embodiments, each of semiconductor layers 120 can include silicon (Si). In some embodiments, each of semiconductor layers 120 can include silicon germanium (SiGe). The semiconductor materials of semiconductor layers 120 can be undoped or can be in-situ doped during their epitaxial growth process. Semiconductor layers 120 can have a vertical dimension 120t (e.g., thicknesses) along a Z-axis ranging from about 5 nm to about 12 nm. Though four layers of semiconductor layers 120 are shown in FIGS. 1-4, finFETs 102A-102B can have any number of semiconductor layers 120.

Referring to FIGS. 1-4, epitaxial fin structures 110 can be disposed between stacked fin portions 108B$_1$ and 108B$_2$. In some embodiments, epitaxial fin structures 110 can have any geometric shape, such as a polygon, an ellipsis, and a circle. Epitaxial fin structures 110 can include an epitaxially-grown semiconductor material. In some embodiments, the epitaxially grown semiconductor material includes the same material as or a different material from substrate 106. In some embodiments, the epitaxially-grown semiconductor material for epitaxial fin structures 110 can be the same as or different from each other.

Referring to FIGS. 1-4, gate structures 112 can be multi-layered structures and can be wrapped around semiconductor layers 120 of stacked fin portions 108B$_1$ and 108B$_2$. In some embodiments, each of semiconductor layers 120 can be wrapped around by one of gate structures 112 or one or more layers of one of gate structures 112, in which gate structures 112 can be referred to as "gate-all-around (GAA) structures" and finFETs 102A and 102B can also be referred to as "GAA FETs 102A-102B" or "GAA finFETs 102A-102B."

Each of gate structures 112 can include a gate dielectric layer disposed on semiconductor layers 120 and a gate electrode disposed on the gate dielectric layer. The gate dielectric layer can be wrapped around each of semiconductor layers 120, and thus electrically isolate semiconductor layers 120 from each other and from the conductive gate electrode to prevent shorting between gate structures 112 and semiconductor layers 120 during operation of finFETs 102A-102B. In some embodiments, the gate dielectric layer can include an interfacial layer and a high-k layer. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9). In some embodiments, the interfacial layer can include silicon oxide. In some embodiments, the high-k layer can include hafnium oxide ($HfO_2$), zirconium oxide ($ZrO_2$), and other suitable high-k dielectric materials.

In some embodiments, the gate electrode can include a gate barrier layer, a gate work function layer, and a gate metal fill layer. Each of semiconductor layers 120 can be wrapped around by one of gate barrier layers and one of gate work function layer. Depending on the space between adjacent semiconductor layers 120 and the thicknesses of the layers of gate structures 112, semiconductor layers 120 can be wrapped around by one or more layers of the gate electrode filling the spaces between adjacent semiconductor layers 120. Though gate structures 112 of finFETs 102A-102B are shown to be similar, finFETs 102A-102B can have gate structures with materials and/or electrical properties (e.g., threshold voltage and work function value) different from each other. Also, though gate structures 112 are shown to have horizontal GAA structures, other gate structures (e.g., vertical GAA structures) are within the scope and spirit of this disclosure.

Referring to FIGS. 1 and 2, gate spacers 114 can form on sidewalls of gate structures 112 and can be in physical contact with portions of the gate dielectric layer, according to some embodiments. Gate spacers 114 can include insulating materials, such as silicon oxide, silicon nitride, a low-k material, and a combination thereof. Gate spacers 114 can include a single layer or a stack of insulating layers. Gate spacers 114 can have a low-k material with a dielectric constant less than about 3.9 (e.g., about 3.5, about 3.0, or about 2.8).

Referring to FIGS. 1-4, semiconductor device 100 can further include an interlayer dielectric (ILD) layer 118 and a protective oxide layer 134. ILD layer 118 can be disposed on epitaxial fin structures 110 and STI regions 104. ILD layer 118 can include a dielectric material deposited using a deposition method suitable for flowable dielectric materials. For example, flowable silicon oxide can be deposited using flowable CVD (FCVD). In some embodiments, the dielectric material can be silicon oxide. Protective oxide layer 134 can be disposed on fin structure 108 and STI regions 104. Protective oxide layer 134 can include a suitable oxide material, such as silicon oxide. In some embodiments, protective oxide layer 134 can protect fin structure 108 during the fabrication processes.

Referring to FIGS. 1-4, semiconductor device 100 can further include inner spacer structures 127. Inner spacer structures 127 can be disposed between semiconductor layers 120 and adjacent to epitaxial fin structures 110 and gate structures 112. Inner spacer structures 127 can include a dielectric material, such as silicon oxynitride (SiON), silicon carbonitride (SiCN$_x$), silicon oxycarbide (SiOC), silicon oxycarbonitride (SiOCN), silicon nitride (SiN$_x$), silicon oxide (SiO$_x$), and a combination thereof. In some embodiments, inner spacer structures 127 can include a single layer of insulating material or multiple layers of insulating materials. In some embodiments, inner spacer structures 127 can isolate gate structures 112 and epitaxial fin structures 110. Inner spacer structures 127 can have a horizontal dimension 127$w$ (e.g., width) along an X-axis ranging from about 4 nm to about 10 nm and a vertical dimension 127$h$ (e.g., height) along a Z-axis ranging from about 5 nm to about 10 nm.

In some embodiments, inner spacer structures 127 can have essentially square (or rectangular) profiles adjacent to gate structures 112, as shown in FIGS. 2-4. In some embodiments, the essentially square (or rectangular) profile has corners that are at or substantially at 90° angles. Inner spacer structures 127 can include a first portion 127-1 in contact with gate structures 112 and a second portion 127-2 adjacent to end portions of semiconductor layers 120. In some embodiments, first portion 127-1 can have rounded corners abutting gate structures 112 and can be a rounded portion of inner spacer structures 127. Second portion 127-2 can be a square portion of inner spacer structures 127. First portion 127-1 can have a vertical dimension 127-1$h$ (e.g., height) along a Z-axis ranging from about 1 nm to about 10 nm and a horizontal dimension 127-1$w$ (e.g., width) along an X-axis less than about 0.5 nm. Second portion 127-2 can have a vertical dimension 127-2$h$ (e.g., height) along a Z-axis larger than vertical dimension 127-1$h$ and ranging from about 5 nm to about 10 nm. Second portion 127-2 can have a horizontal dimension 127-2$w$ (e.g., width) along an X-axis ranging from about 4 nm to about 10 nm. In some embodiments, horizontal dimension 127-2$w$ can represent the effective thickness of inner spacer structures 127. Horizontal dimension 127$w$ can be a sum of horizontal dimensions 127-1$w$ and 127-2$w$. Vertical dimension 127-2$h$ can be substantially the same as vertical dimension 127$h$. In some embodiments, a ratio of horizontal dimension 127-1$w$ to a sum (e.g., 127$w$) of horizontal dimensions 127-1$w$ and 127-2$w$ can be less than about 0.05.

As a result, inner spacer structures 127 can have an essentially square (or rectangular) profile. If horizontal dimension 127-1$w$ is greater than about 0.5 nm (e.g., about 1.5 nm), or the ratio of horizontal dimension 127-1w to a sum (e.g., 127w) of horizontal dimensions 127-1w and 127-2w is greater than about 0.05, inner spacer structures 127 can have a rounded profile adjacent to gate structures 112 and the effective thickness of inner spacer structures 127 can be reduced. As a result, epitaxial fin structures 110 can be damaged during sheet formation of semiconductor layers 120 and epitaxial structure defects formed by the damage can lower process yield and degrade device performance. With essentially square (or rectangular) profiles, inner spacer structures 127 can have increased effective thickness and can reduce epitaxial structure defects, thereby improving process yield and device performance. In some embodiments, epitaxial structure defects can be reduced from about 30-50% to a level below about 10% and the process yield can be improved by about 10% to about 30%.

Figure 5:
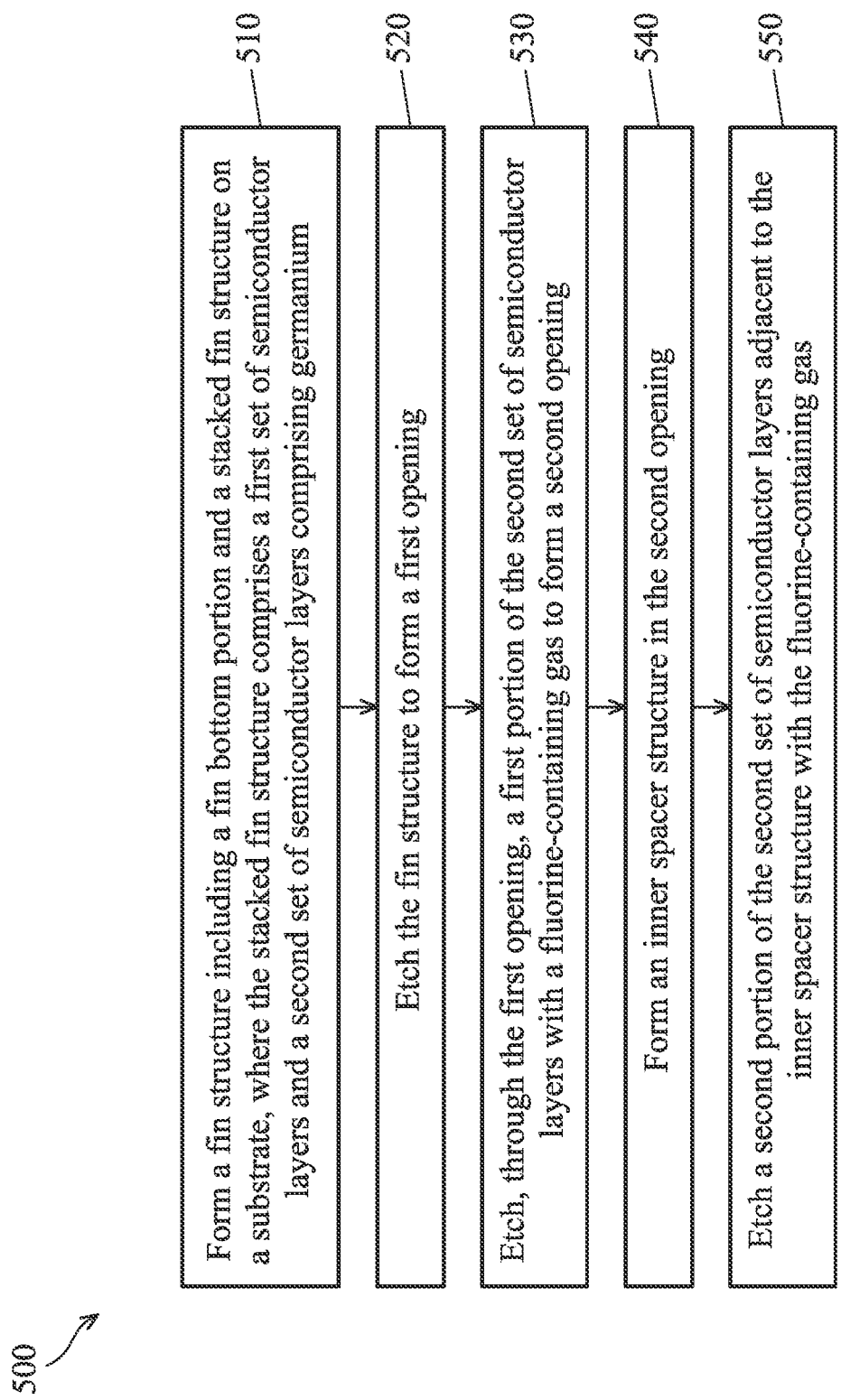
FIG. 5 is a flow diagram of a method for fabricating a semiconductor device by a dry etching process with a fluorine-containing gas, in accordance with some embodiments.

FIG. 5 is a flow diagram of a method 500 for fabricating semiconductor device 100 by a dry etching process with a fluorine-containing gas, in accordance with some embodiments. Method 500 may not be limited to finFET devices and can be applicable to devices, such as planar FETs, finFETs, and GAA FETs, that would benefit from an essentially square (or rectangular) etching profile formed by the dry etching process with a fluorine-containing gas. Additional fabrication operations may be performed between various operations of method 500 and may be omitted merely for clarity and ease of description. Additional processes can be provided before, during, and/or after method 500; one or more of these additional processes are briefly described herein. Moreover, not all operations may be needed to perform the disclosure provided herein. Additionally, some of the operations may be performed simultaneously or in a different order than shown in FIG. 5. In some embodiments, one or more other operations may be performed in addition to or in place of the presently described operations.

For illustrative purposes, the operations illustrated in FIG. 5 will be described with reference to the example fabrication process for fabricating semiconductor device 100 as illustrated in FIGS. 6-12 and 16-20. FIGS. 6, 7, 11, 12, 16, 17, and 19 are partial cross-sectional views of semiconductor device 100 along line B-B of FIG. 1 at various stages of its fabrication, according to some embodiments. FIGS. 8-10, 18, and 20 are partial planar views of semiconductor device 100 across plane D of FIG. 2 at various stages of its fabrication, according to some embodiments. Although FIGS. 6-12 and 16-20 illustrate fabrication processes of semiconductor device 100 formed by a dry etching process with a fluorine-containing gas, method 500 can be applied to other etching processes for an essentially square etching profile. Elements in FIGS. 6-12 and 16-20 with the same annotations as elements in FIGS. 1-4 are described above.

Figure 6:
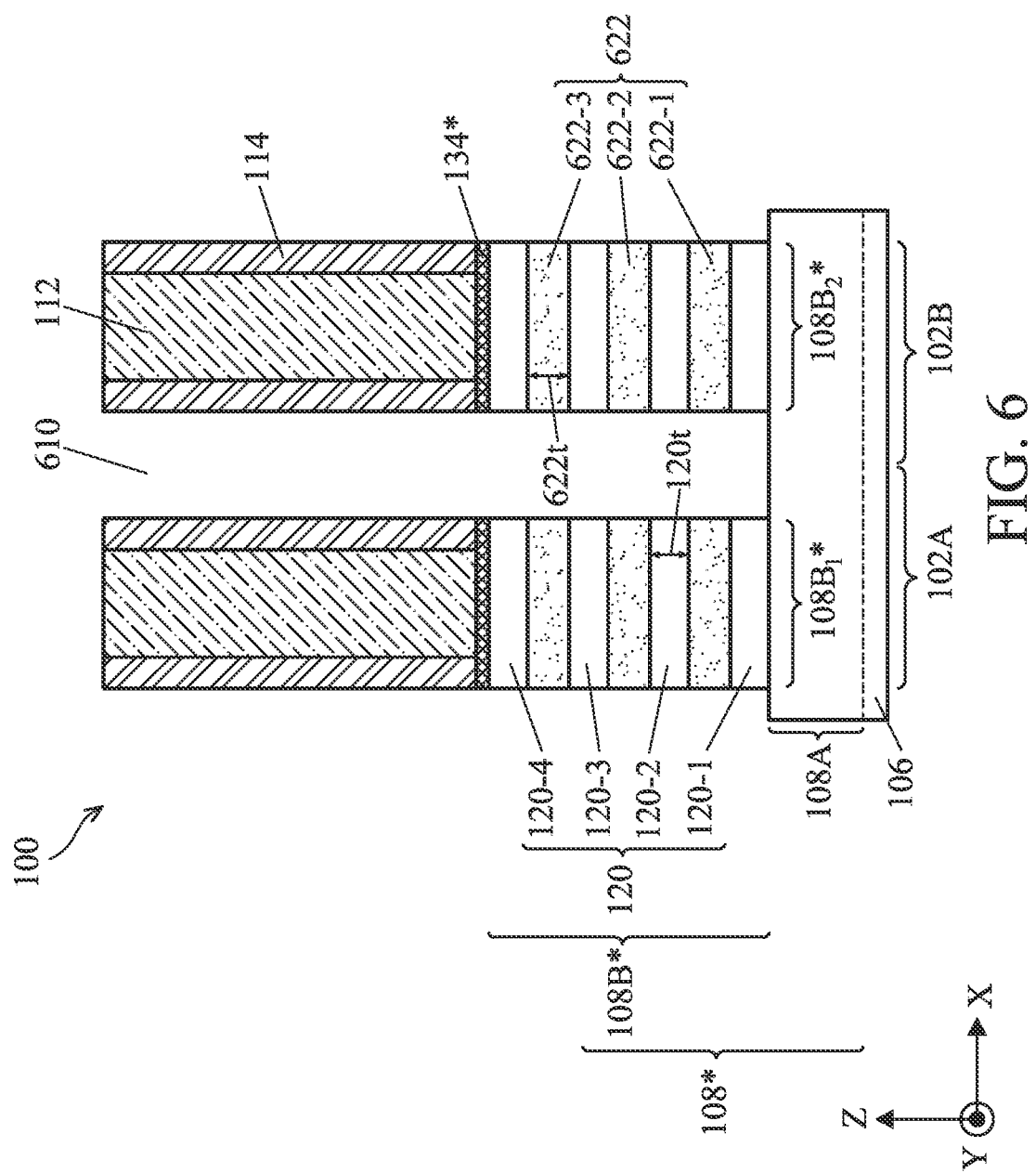
FIGS. 6-12 and 16-20 illustrate partial cross-sectional views and planar views of a semiconductor device formed by a dry etching process with a fluorine-containing gas at various stages of its fabrication process, in accordance with some embodiments.

In referring to FIG. 5, method 500 begins with operation 510 and the process of forming a fin structure including a fin bottom portion and a stacked fin portion on a substrate. The stacked fin portion includes a first set of semiconductor layers and a second set of semiconductor layers including germanium. The first and second set of semiconductor layers are stacked in an alternating configuration. For example, as shown in FIG. 6, fin structure 108* with fin bottom portion 108A and fin top portion 108B* can be formed on substrate 106. Protective oxide layer 134* can be formed on fin structures 108*. Sacrificial gate structures 612 can be formed on protective oxide layer 134*. Gate spacers 114 can be formed on sidewalls of sacrificial gate structures 612. Fin top portion 108B* can include stacked fin portions 108B$_1$* and 108B$_2$*. Stacked fin portions 108B$_1$* and 108B$_2$* can include a first set of semiconductor layers 120-1, 120-2, 120-3, and 120-4 (collectively referred to as "semiconductor layers 120") and a second set of semiconductor layers 622-1, 622-2, and 622-3 (collectively referred to as "semiconductor layers 622").

Each semiconductor layer in stacked fin portions 108B$_1$ and 108B$_2$* can be epitaxially grown on its underlying layer. In some embodiments, semiconductor layers 120 and 622 can include semiconductor materials similar to or different from substrate 106. In some embodiments, semiconductor layers 120 and 622 can include semiconductor materials with oxidation rates and/or etch selectivity different from each other. In some embodiments, semiconductor layers 622 can include silicon germanium (SiGe) with Ge in a range from about 40 atomic percent to about 100 atomic percent with any remaining atomic percent being Si. If the Ge concentration is lower than about 40 atomic percent, the etch selectivity between semiconductor layers 120 and semiconductor layers 622 may be reduced and semiconductor layers 120 may be etched during removal of semiconductor layers 622. In some embodiments, the etch selectivity can be increased when the Ge concentration is between about 40 atomic percent and about 60 atomic percent. In some embodiments, the etch selectivity may be reduced when the Ge concentration is higher than about 60 atomic percent due to non-volatile germanium fluoride (GeF$_x$) by-products. In some embodiments, semiconductor layers 120 can include Si without any substantial amount of Ge. The semiconductor materials of semiconductor layers 120 and 622 can be undoped or can be in-situ doped during their epitaxial growth process. Semiconductor layers 120 can have a vertical dimension 120t (e.g., thickness) along a Z-axis ranging from about 5 nm to about 12 nm. Semiconductor layers 622 can have a vertical dimension 622t (e.g., thickness) along a Z-axis ranging from about 5 nm to about 10 nm. Vertical dimensions 120t and 622t can be equal to or different from each other. Though four semiconductor layers 120 and three semiconductor layers 622 for stacked fin portions 108B$_1$* and 108B$_2$* are shown in FIG. 6, semiconductor device 100 can have any number of semiconductor layers 120 and 622.

Referring to FIG. 5, in operation 520, the fin structure is etched to form a first opening. For example, as shown in FIG. 6, fin structure 108 can be etched to form openings 610. In some embodiments, openings 610 can be formed by a vertical etch. In some embodiments, the vertical etch of semiconductor layers 120 and 622 can include a biased etching process. In some embodiments, the biased etching process can be directional and semiconductor layers 120 and 622 can have substantially no lateral etch. In some embodiments, the biased etching process can be controlled by time and an over etch can form a dip in fin bottom portion 108A (not shown in FIG. 6). In some embodiments, S/D epitaxial fin structures can be formed in openings 610 in subsequent processes.

Referring to FIG. 5, in operation 530, a first portion of the second set of semiconductor layers is etched through the first opening with a fluorine-containing gas to form a second opening. For example, as shown in FIGS. 7-10, semiconductor layers 622 can be etched to form openings 727. FIGS. 8-10 illustrate partial planar views of semiconductor device 100 across plane D of FIG. 7 during the etching process, according to some embodiments. In some embodiments, semiconductor layers 622 can be etched by a dry etching process. The dry etching process can include one or more fluorine-containing gases as main etchants. The fluorine-containing gases can include one or more of fluorine (F$_2$), hydrogen fluoride (HF), chlorine trifluoride (ClF$_3$), a fluorine radical (F*), and a nitrogen trifluoride radical (NF$_3$*). In some embodiments, semiconductor layers 622 can be etched by a gas phase etching using fluorine-containing gases, such as F$_2$, HF, and ClF$_3$. In some embodiments, semiconductor layers 622 can be etched by a radical phase etching using radicals, such as F*, H*, and NF$_3$*, generated from fluorine-containing gases by a remote plasma system. The dry etching process can have by-products, such as silicon tetrafluoride (SiF$_4$) and germanium tetrafluoride (GeF$_4$).

In some embodiments, the fluorine-containing gases can have a flow rate ranging from about 1 standard cubic centimeters per minute (sccm) to about 500 sccm. If the flow rate is less than about 1 sccm, semiconductor layers 622 may not be etched by the fluorine-containing gases. If the flow rate is greater than about 500 sccm, etch rate of the fluorine-containing gases can increase and etch selectivity between semiconductor layers 622 and adjacent structures (e.g., semiconductor layers 120 and gate spacers 114) may decrease. As a result, adjacent structures (e.g., semiconductor layers 120 and gate spacers 114) may be damaged during the dry etching process. In some embodiments, the dry etching process can be performed at a temperature from about −20° C. to about 350° C. under a pressure from about 10 mTorr to about 10000 mTorr. If the temperature is less than about −20° C. and/or the pressure is less than about 10 mTorr, semiconductor layers 622 may not be etched by the fluorine-containing gases. If the temperature is greater than about 350° C. and/or the pressure is greater than about 10000 mTorr, the etch rate of the fluorine-containing gases can increase and etch selectivity between semiconductor layers 622 and adjacent structures (e.g., semiconductor layers 120 and gate spacers 114) may decrease. As a result, adjacent structures (e.g., semiconductor layers 120 and gate spacers 114) may be damaged during the dry etching process.

Figure 7:
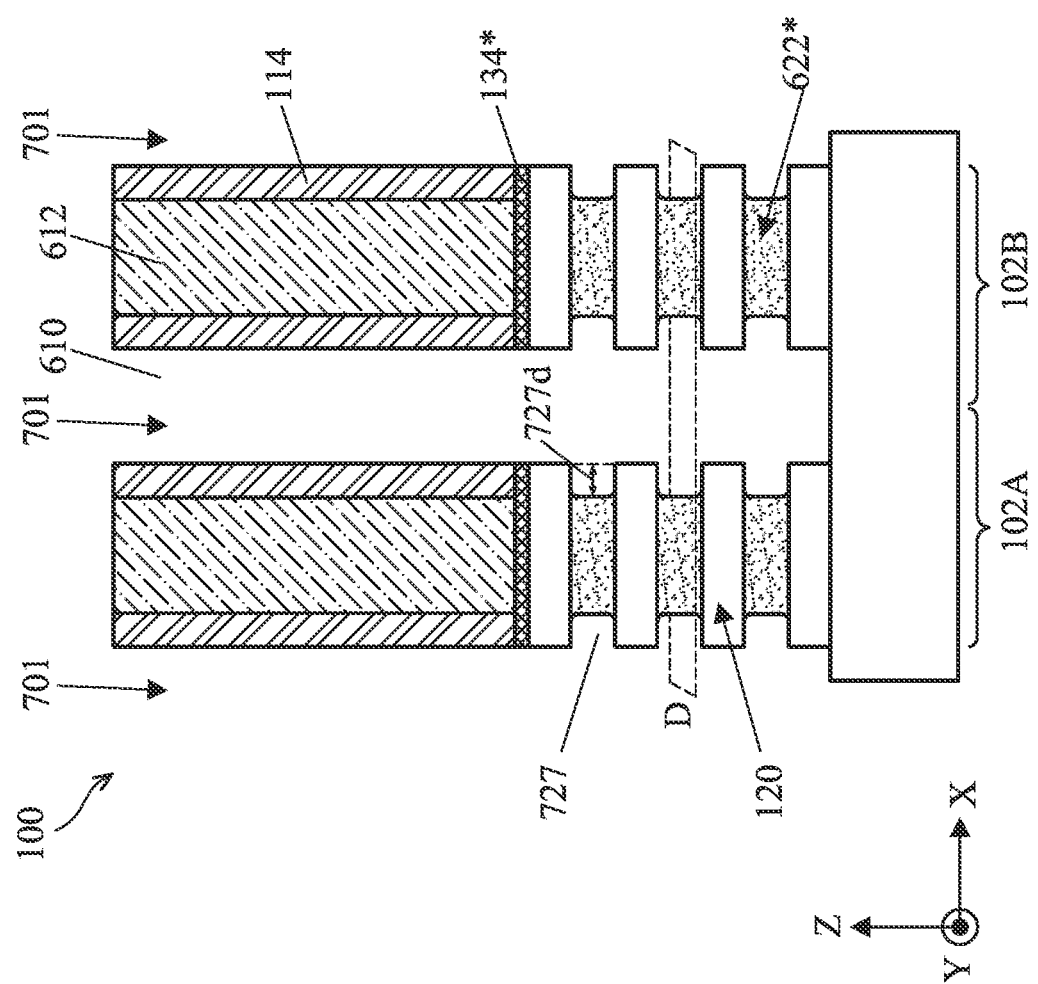
Figure 8:
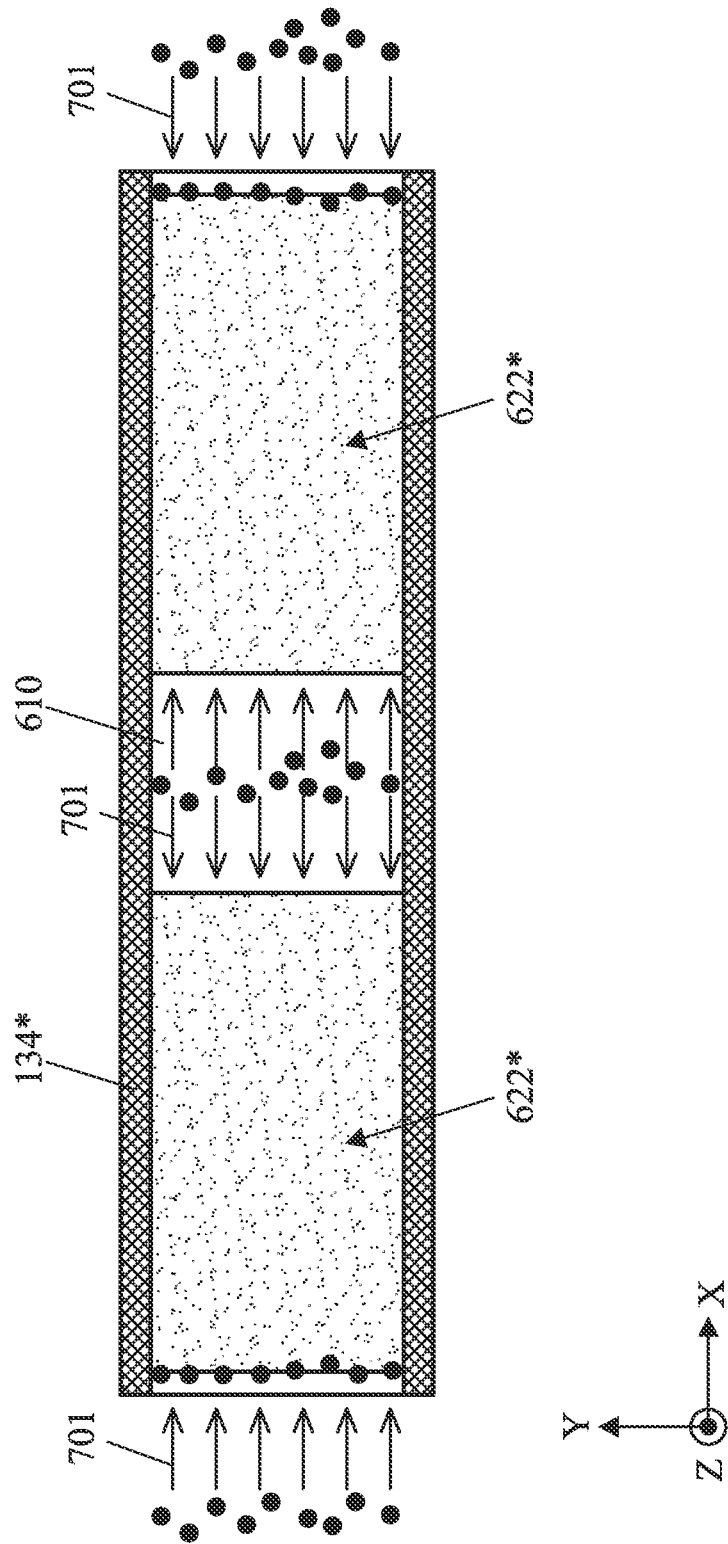
Figure 9:
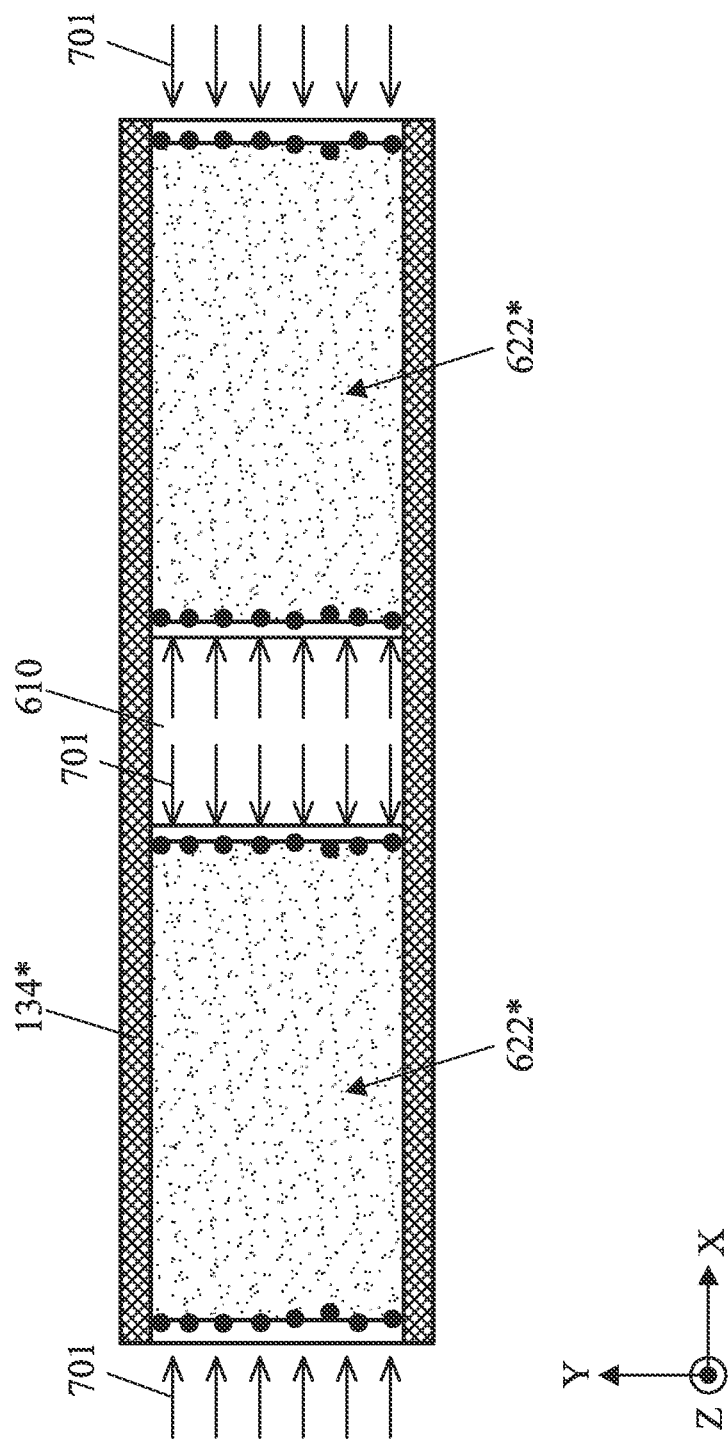
Figure 10:
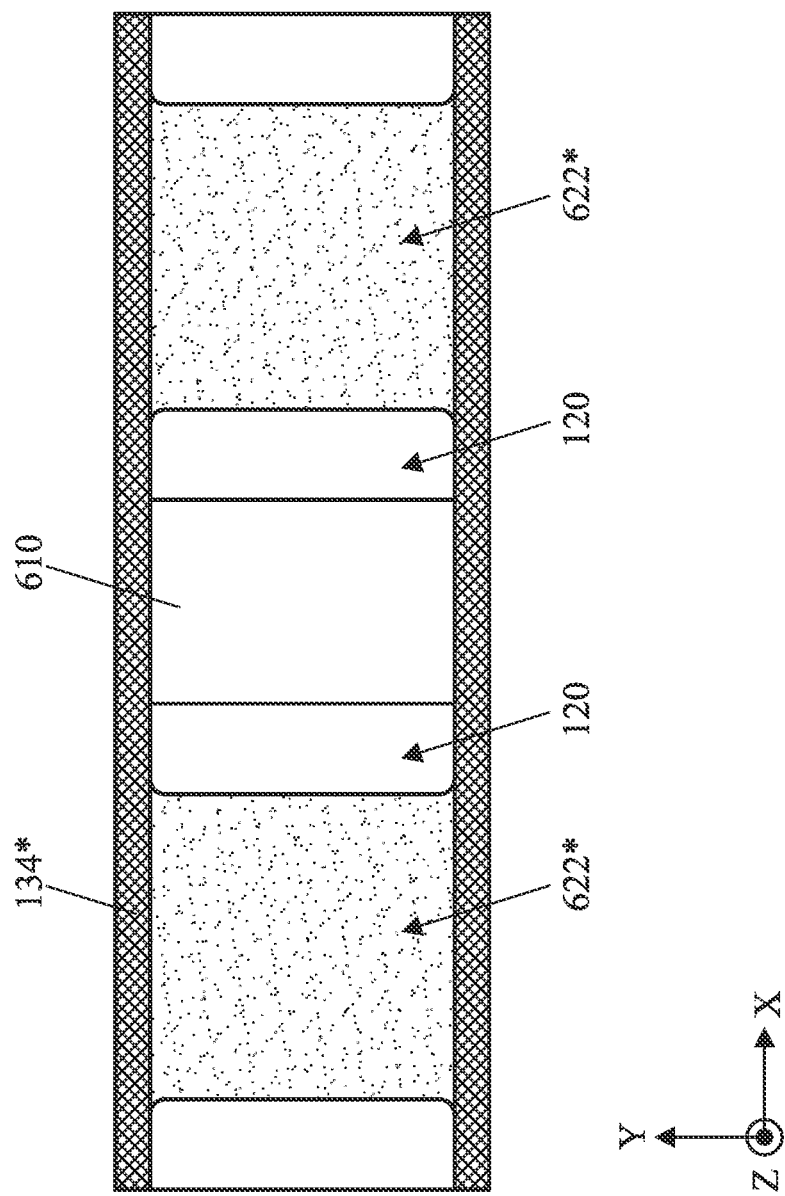

As shown in FIGS. 7-9, the fluorine-containing gases can be delivered to semiconductor layers 622 through openings 610 during the dry etching process, indicated by arrows 701. In some embodiments, as shown in FIGS. 8 and 9, the fluorine-containing gases can adsorb on exposed surfaces of semiconductor layers 622 and etch exposed surfaces of semiconductor layers 622. With control of the flow rate of the fluorine-containing gases and the temperature and pressure of the dry etching process, the fluorine-containing gases can evenly distribute on the exposed surfaces of semiconductor layers 622. As a result, semiconductor layers 622 can be recessed along an X-axis and form openings 727 having an essentially square (or rectangular) profile, as shown in FIGS. 7 and 10. In some embodiments, semiconductor layers 622 can be etched at an etching rate ranging from about 0.1 nm/s to about 10 nm/s. The etching time can be from about 10 s to about 500 s and semiconductor layers 622 can be recessed at a depth 727*d* along an X-axis ranging from about 4 nm to about 10 nm. The etch selectivity between semiconductor layers 622 and adjacent structure (e.g., semiconductor layers 120 and gate spacers 114) can range from about 10 to about 500. If the etch selectivity is less than about 10, semiconductor layers 120 and gate spacers 114 may be damaged during the dry etching process. If the etch selectivity is greater than about 500, the cost to etch semiconductor layers 622 may increase. In some embodiments, the etch selectivity between semiconductor layers 622 and gate spacers 114 can be higher than about 100. In some embodiments, the etch selectivity between semiconductor layers 622 and semiconductor layers 120 can be range from about 10 to about 200.

Compared to wet etching processes to oxidize semiconductor layers 622 and remove oxidized semiconductor layers 622, fluorine-containing gases in the dry etching process can be better distributed at corners of semiconductor layers 622. During the oxidation process in the wet etching processes, corners and sidewalls of semiconductor layers 622 may not be oxidized due to a diffusion limit of the oxidation process at corners and sidewalls. As a result, the wet etching process may not etch corners and sidewalls of semiconductor layers 622, forming a rounded profile and thereby epitaxial structure defects in subsequent processes. With improved etching at corners and sidewalls of semiconductor layers 622 by the fluorine-containing gases, the dry etching process can form an essentially square (or rectangular) profile and prevent epitaxial structure defects. In some embodiments, the dry etching process with fluorine-containing gases can reduce epitaxial structure defects from about 30%-50% to a level below about 10% and the process yield can be improved by about 10% to about 30%.

Figure 11:
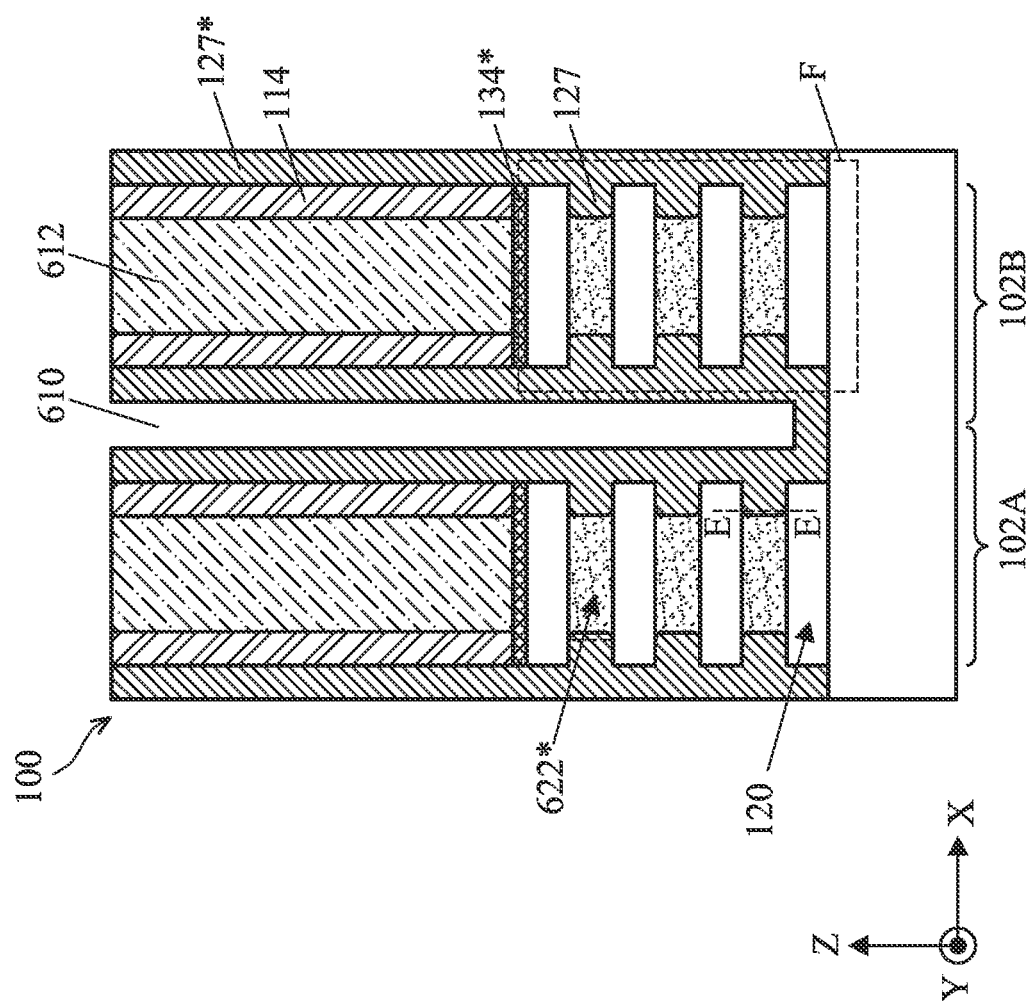
Figure 12:
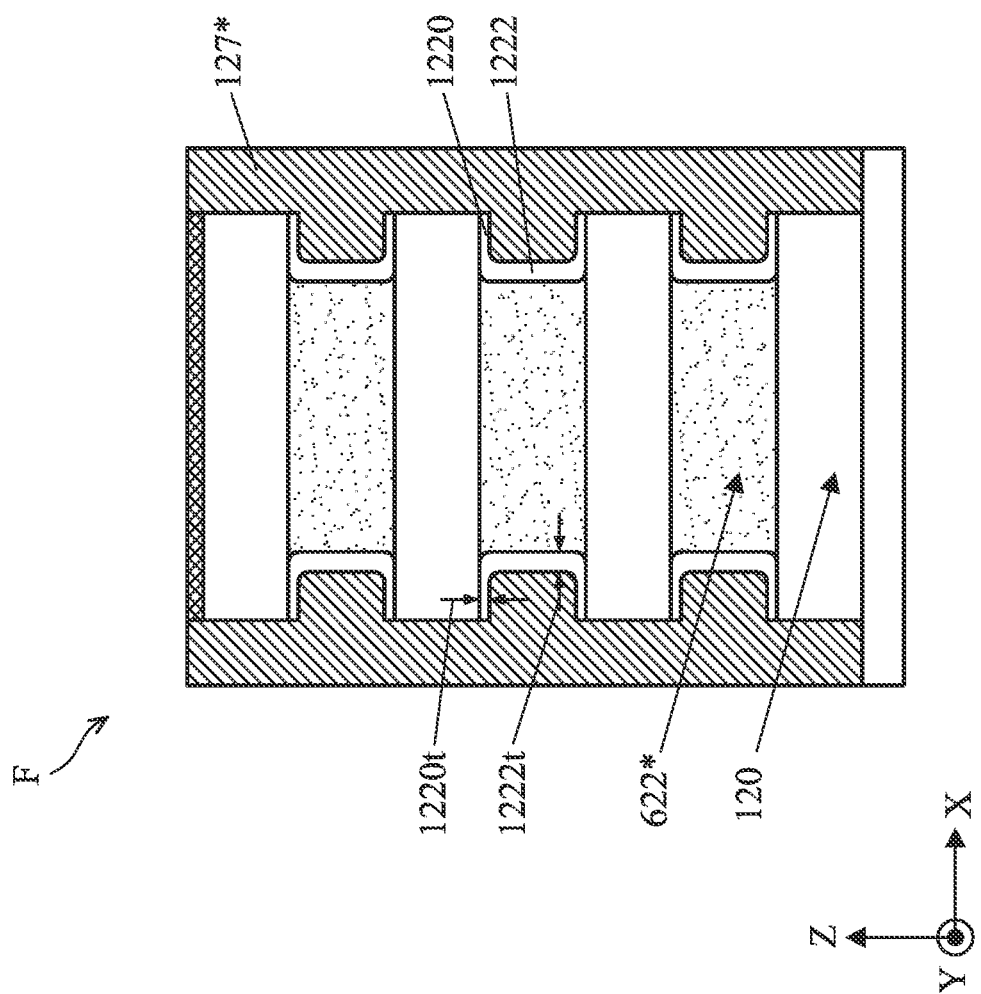
Figure 16:
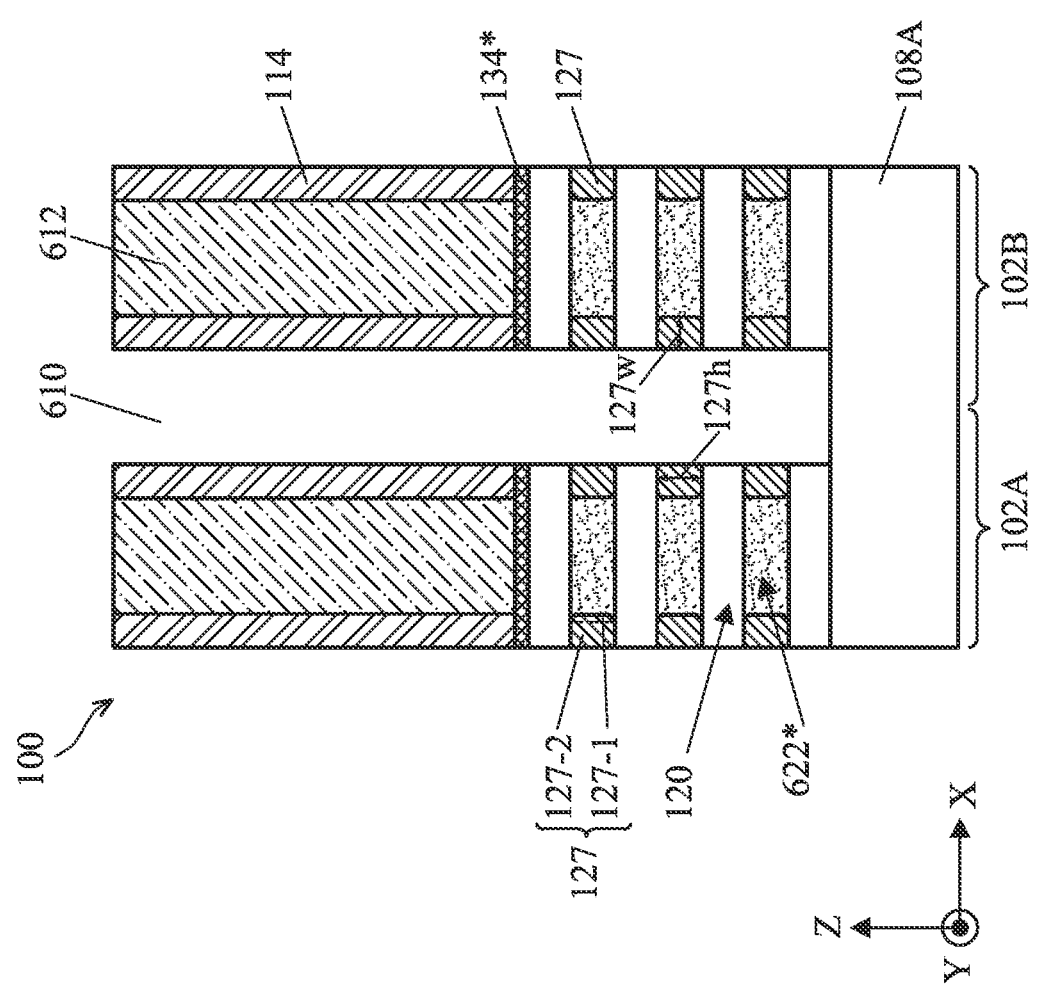

Referring to FIG. 5, in operation 540, an inner spacer structure is formed in the second opening. For example, as shown in FIGS. 11, 12, and 16, inner spacer structures 127 can be formed in openings 727 (shown in FIG. 7), where the first portion of semiconductor layers 622 is removed. FIG. 12 illustrates a zoomed-in area F of the partial cross-sectional view of FIG. 11, according to some embodiments. The formation of inner spacer structures 127 can include a blanket deposition of an inner spacer layer 127* and a lateral etch of the blanket deposited inner spacer layer 127*. In some embodiments, inner spacer layer 127* can include a single layer or a stack of dielectric layers, deposited by atomic layer deposition (ALD), chemical vapor deposition (CVD), or other suitable methods. In some embodiments, inner spacer layer 127* can include a dielectric material, such as silicon oxynitride (SiON), silicon carbonitride (SiCN), silicon oxycarbide (SiOC), silicon oxynitricarbide (SiOCN), silicon nitride (SiN$_x$), silicon oxide (SiO$_x$), and a combination thereof. The blanket deposition can fill openings 610 with the dielectric material and cover exposed surfaces of finFETs 102A-102B. The lateral etch of inner spacer layer 127* can be performed by a dry etching process using a gas mixture of hydrogen fluoride (HF) and ammonia (NH$_3$). After the lateral etch process, inner spacer layer 127* can be removed from end portions of semiconductor layers 120 and bottom surfaces of openings 610. Inner spacer structures 127 can be formed between semiconductor layers 120 and adjacent to semiconductor layers 622*, as shown in FIG. 16. Inner spacer structures 127 can have a horizontal dimension 127*w* (e.g., width) along an X-axis ranging from about 4 nm to about 10 nm and a vertical dimension 127*h* (e.g., height) along a Z-axis ranging from about 5 nm to about 10 nm. In some embodiments, vertical dimension 127*h* can be substantially the same as vertical dimension 622*t* of semiconductor layers 622. Inner spacer structures 127 can have essentially square (or rectangular) profiles and can include first portion 127-1 and second portion 127-2 as described in FIG. 3.

Figure 13:
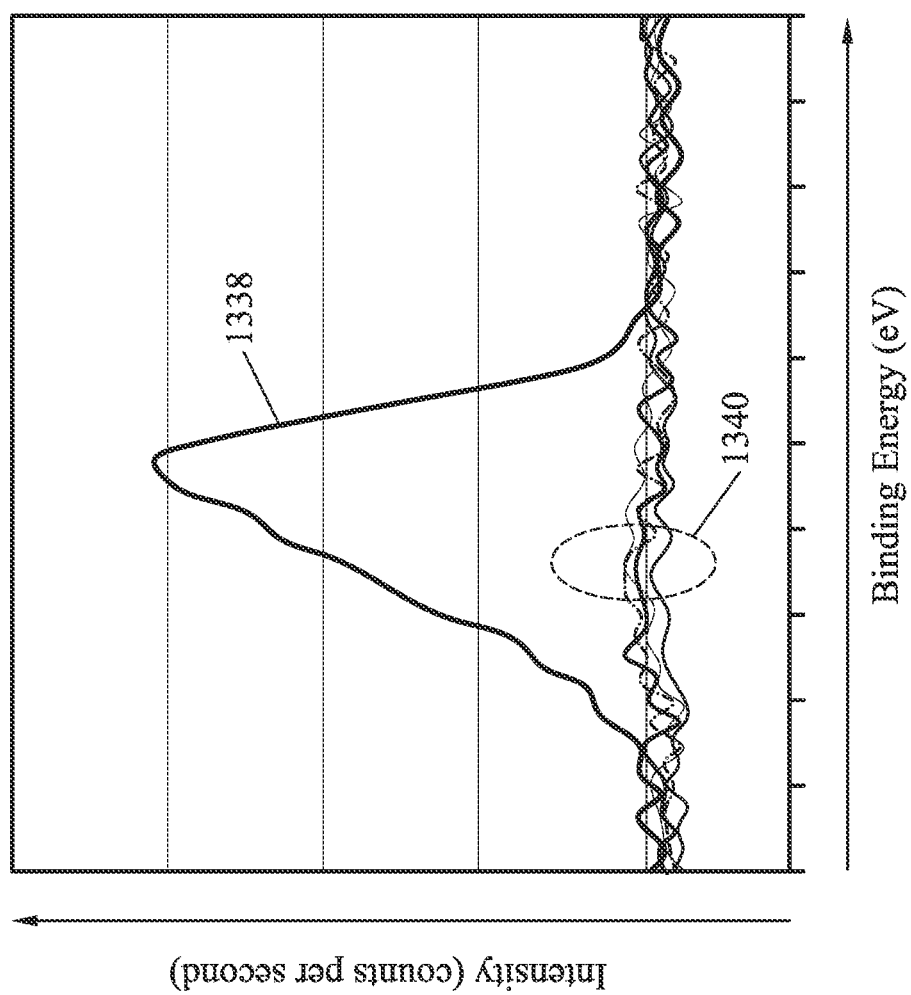
FIGS. 13 and 14 illustrate surface fluorine signals of a semiconductor device after etching with a fluorine-containing gas, in accordance with some embodiments.
Figure 14:
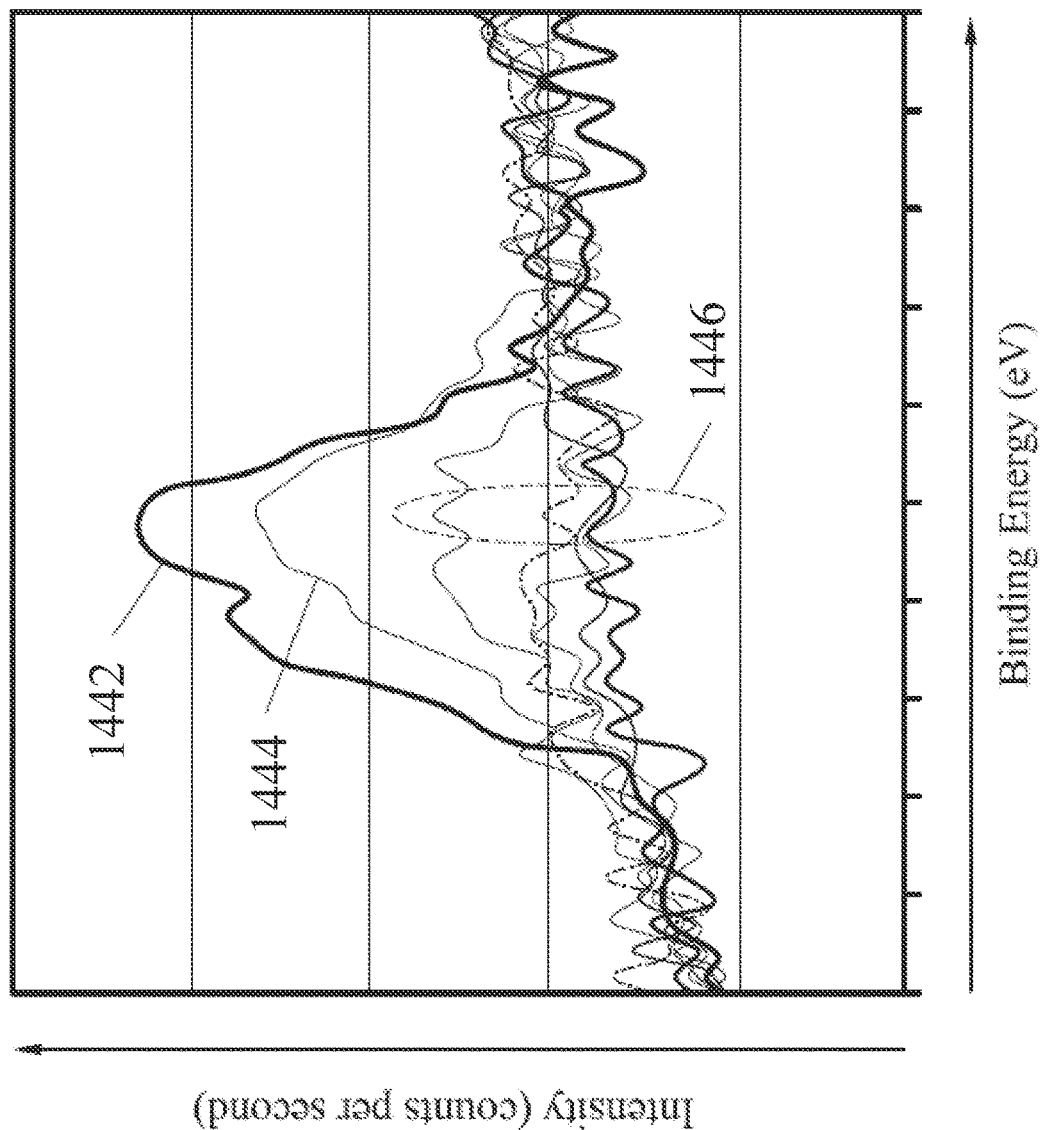

In some embodiments, after dry etching of the first portion of semiconductor layers 622 with the fluorine-containing gases, fluorine residues can remain on etched surfaces of semiconductor layers 120 and 622 adjacent to inner spacer structures 127. For example, as shown in FIGS. 12, 13, and 14, etched surfaces of semiconductor layers 622 can have a fluorine residue layer 1222 and etched surfaces of semiconductor layers 120 can have a fluorine residue layer 1220. In some embodiments, fluorine residue layer 1222 can have a thickness 1222*t* ranging from about 0.3 nm to about 0.7 nm.

Fluorine residue layer 1220 can have a thickness 1220t ranging from about 0.1 nm to about 0.5 nm. As shown in FIG. 13, semiconductor layers 622* with fluorine residue layer 1222 can have higher fluorine signals (e.g., X-ray photoelectron spectroscopy signals) in profile 1338 compared to profiles 1340 for etched surfaces of semiconductor layers 622 using wet etching processes. As shown in FIG. 14, semiconductor layers 622* with fluorine residue layer 1220 can have higher fluorine signals (e.g., X-ray photoelectron spectroscopy signals) in profiles 1442 and 1444 compared to profiles 1446 for etched surfaces of semiconductor layers 120 using the wet etching processes.

Figure 15A:
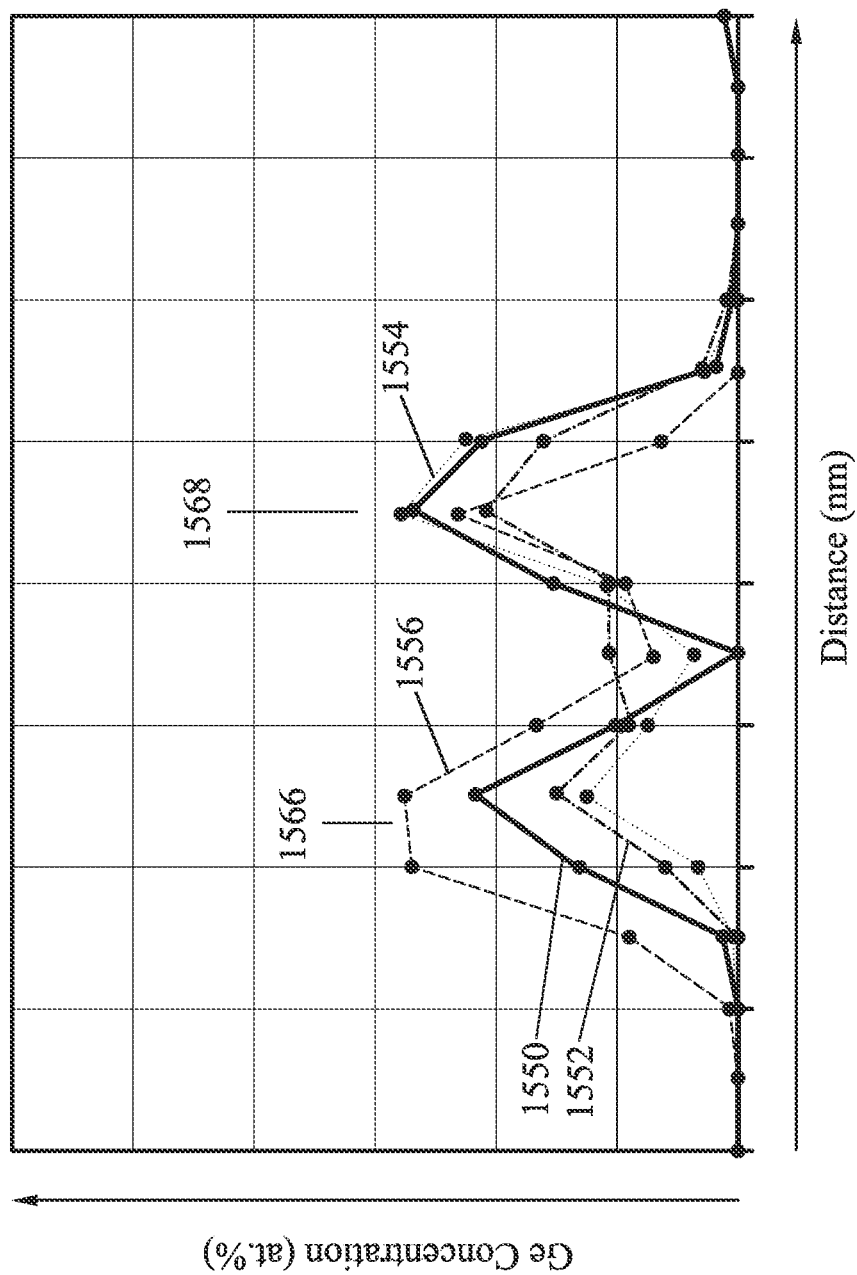

In some embodiments, the dry etching process with fluorine-containing gases can remove semiconductor layers 622 at corners adjacent to semiconductor layers 120 and form an essentially square (or rectangular) profile. In some embodiments, as shown in FIGS. 15A and 15B, profiles 1550, 1552, 1554, and 1556 can illustrate Ge concentration profiles along line E-E in FIG. 11 using the wet etching processes, and profiles 1558, 1560, 1562, and 1564 can illustrate Ge concentration profiles along line E-E in FIG. 11 using the dry etching process with fluorine-containing gases. Line E-E can be around the interface between semiconductor layers 622* and inner spacer layers 127*. Peaks 1566 and 1568 in FIG. 15A can illustrate higher Ge concentrations at corners adjacent to semiconductor layers 120, which can indicate a rounded sidewall profile of semiconductor layers 622* using the wet etching processes. Profiles 1558, 1560, 1562, and 1564 in FIG. 15B can illustrate relative flat Ge concentration profiles, which can indicate an essentially square sidewall profile of semiconductor layers 622* using the dry etching process with fluorine-containing gases. As a result, using the dry etching process with fluorine-containing gases, inner spacer structures 127 can have a greater effective thickness and better prevention of epitaxial structure defects, as compared to using wet etching processes.

Figure 17:
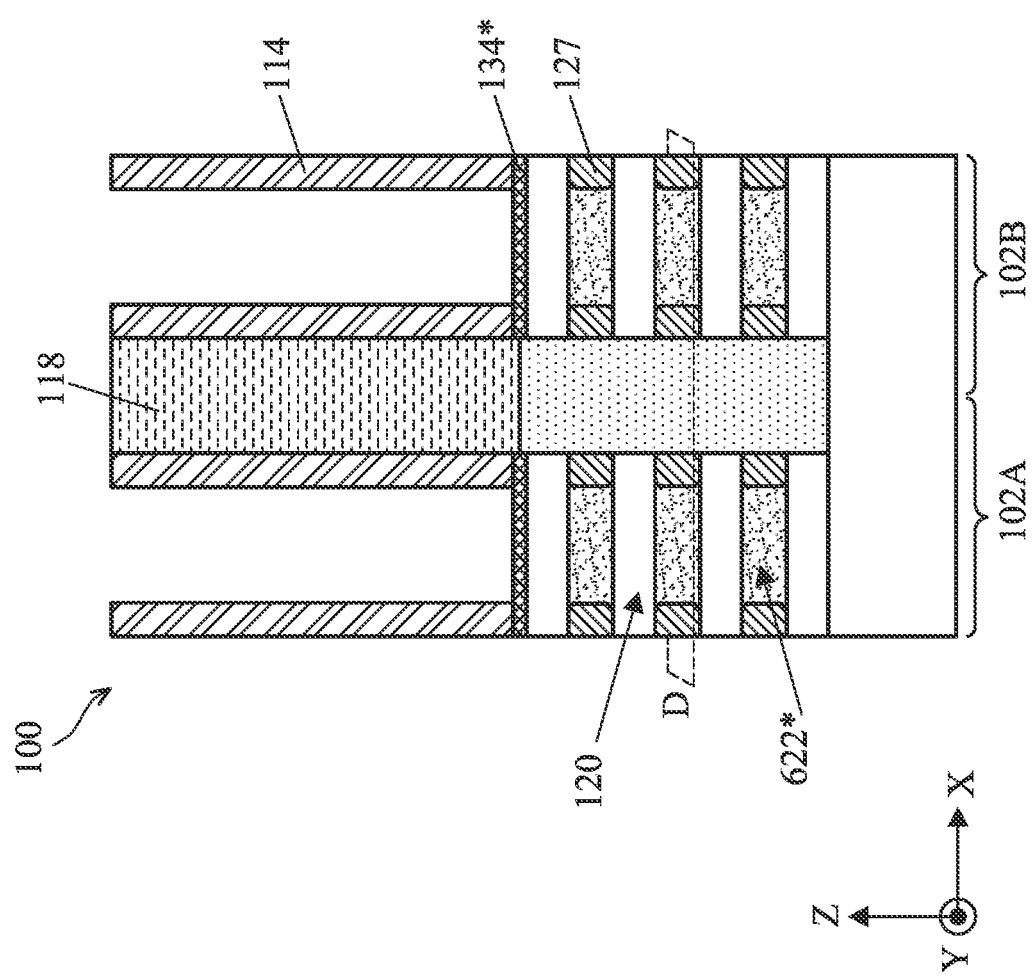
Figure 18:
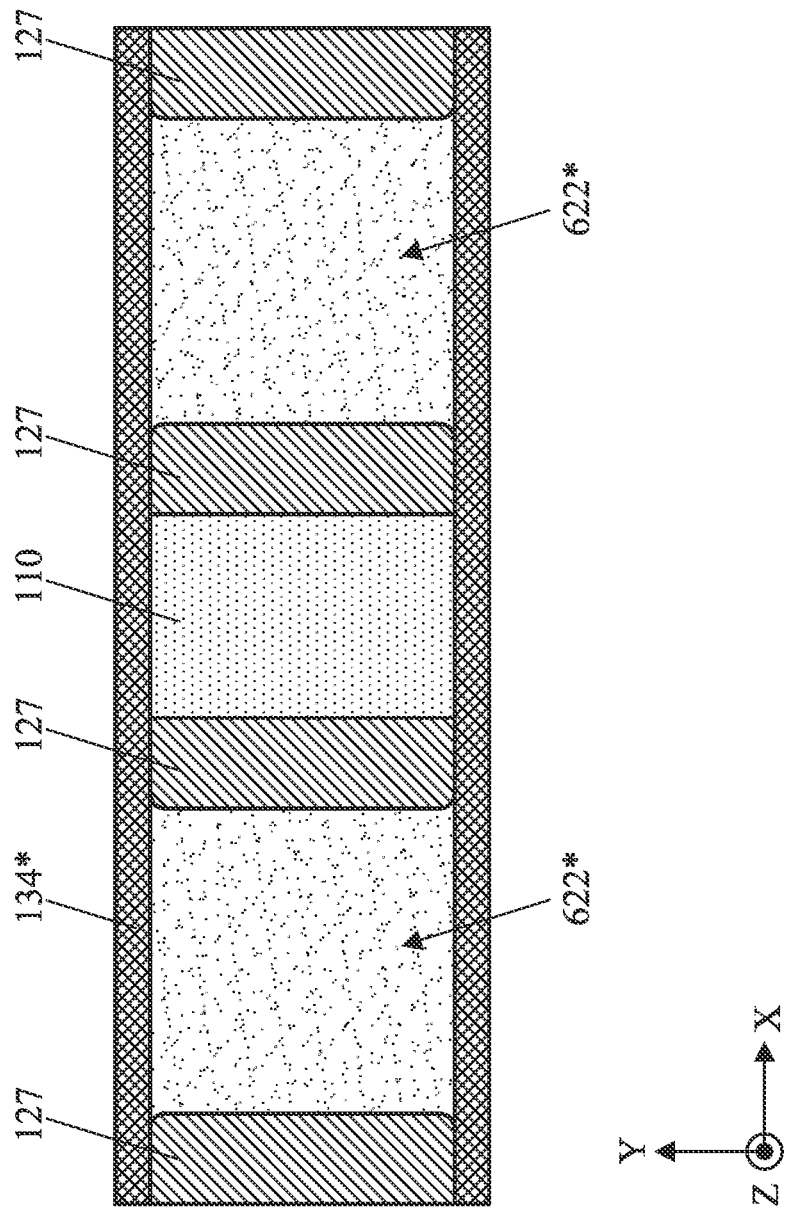
Figure 19:
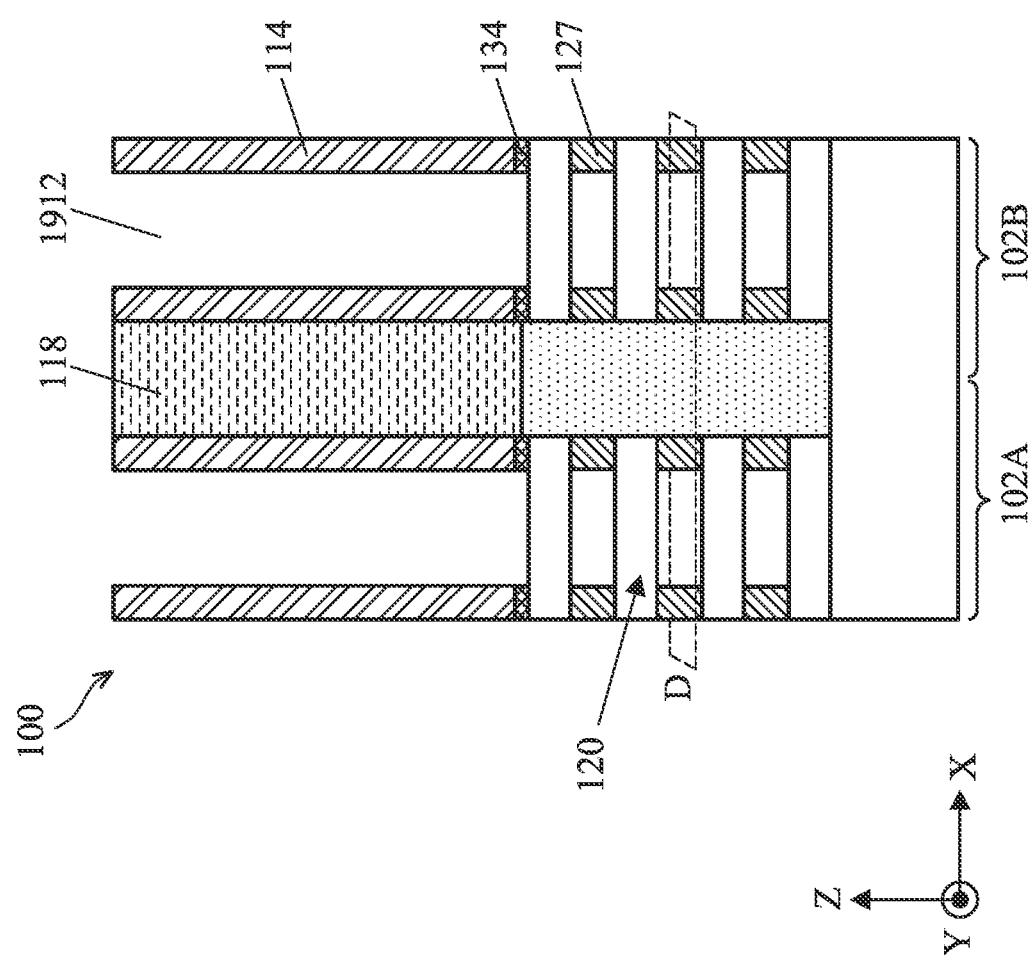
Figure 20:
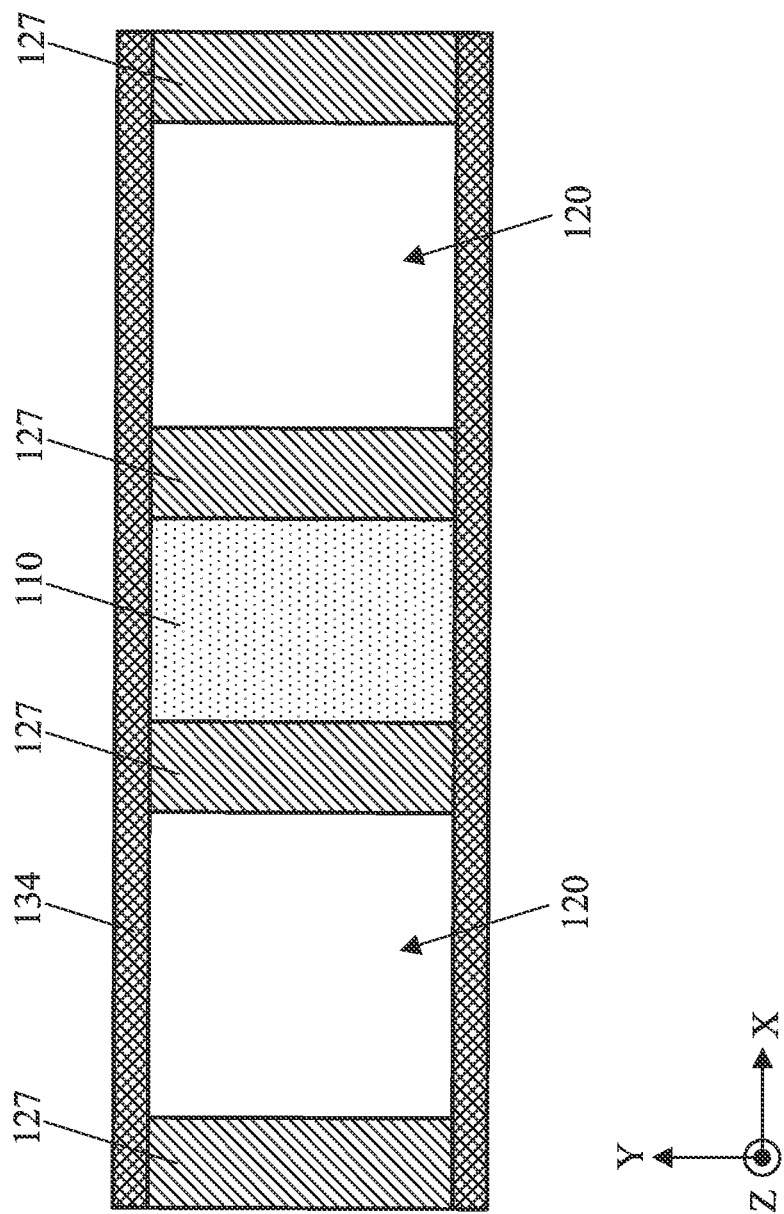

Referring to FIG. 5, in operation 550, s second portion of the second set of semiconductor layers adjacent to the inner spacer structure is etched with the fluorine-containing gases. For example, as shown in FIGS. 17-20, the remaining portion of semiconductor layers 622 (e.g., semiconductor layers 622*) adjacent to inner spacer structures 127 can be removed by the dry etching process with fluorine-containing gases to form sheets of semiconductor layers 120. The formation of sheets of semiconductor layers 120 can include formation of epitaxial fin structures 110 and ILD layer 118, removal of sacrificial gate structures 612, and removal of semiconductor layers 622*. FIG. 18 illustrates a planar view across plane D of semiconductor device 100 as shown in FIG. 17 after formation of epitaxial fin structures 110 and ILD layer 118, according to some embodiments. FIG. 20 illustrates a planar view across plane D of semiconductor device 100 as shown in FIG. 19 after removal of semiconductor layers 622*, according to some embodiments.

As shown in FIGS. 17 and 18, the formation of inner spacer structures 127 can be followed by formation of epitaxial fin structures 110 and ILD layer 118. In some embodiments, epitaxial fin structures 110 can be epitaxially grown on exposed surfaces of semiconductor layers 120 and fin bottom portion 108A in openings 610 (shown in FIG. 16). In some embodiments, epitaxial fin structures 110 can include multiple epitaxial fin sub-structures. A flowable dielectric material can be deposited in openings 610 followed by a chemical mechanical polishing (CMP) process to form ILD layer 118.

The formation of epitaxial fin structures 110 and ILD layer 118 can be followed by removal of sacrificial gate structures 612, as shown in FIG. 17. In some embodiments, sacrificial gate structures 612 can be removed by a dry etching process, a wet etching process, or a combination thereof. In some embodiments, portions of protective oxide layer 134* under sacrificial gate structures 612 can be removed during the removal of sacrificial gate structures 612.

The removal of sacrificial gate structures 612 can be followed by removal of semiconductor layers 622* to form openings 1912, as shown in FIGS. 19 and 20. In some embodiments, semiconductor layers 622* can be removed by the same dry etching process with fluorine-containing gases described in operation 530 with respect to FIGS. 7-10. With the fluorine-containing gases, semiconductor layers 622* can be removed between semiconductor layers 120. As inner spacer structures 127 can have an essentially square (or rectangular) profile, the fluorine-containing gases may not etch epitaxial fin structures 110 through corners of inner spacer structures 127. In some embodiments, using wet etching processes to remove the first portion of semiconductor layers 622, epitaxial fin structures 110 can have about 0.5% epitaxial structure defects (e.g., damaged epitaxial fin structures 110) with inner spacer structures 127 having a thickness about 4 nm. In some embodiments, using the dry etching process with fluorine-containing gases to remove the first portion of semiconductor layers 622, epitaxial fin structures 110 can have essentially no epitaxial structure defects with inner spacer structures 127 having substantially the same thickness of about 4 nm. Using the dry etching process with fluorine-containing gases can form an essentially square (or rectangular) profile and increase effective thickness of inner spacer structures 127, thereby reducing epitaxial structure defects. In some embodiments, p-type epitaxial fin structures can have more epitaxial structure defects or larger epitaxial structure defects (e.g., larger voids), as p-type epitaxial fin structures may include germanium and can be damaged more easily by fluorine-containing gases. In some embodiments, the epitaxial structure defects can short gate structures 112 and source/drain epitaxial fin structures 110 and degrade device performance. Using the dry etching process with fluorine-containing gases to remove the first portion of semiconductor layers 622, epitaxial structure defects can be reduced from about 30%-50% to a level below about 10% and the device performance can be improved by about 10% to about 30%.

The removal of semiconductor layers 622* can be followed by the formation of gate structures 112, as shown in FIGS. 1-4. The formation of gate structures 112 can include formation of a gate dielectric layer and formation of a gate electrode. The formation of the gate dielectric layer can include deposition of an interfacial layer and deposition of a high-k layer. In some embodiments, the interfacial layer can include silicon oxide and can be deposited by ALD, CVD, or other suitable methods. In some embodiments, the interfacial layer can include silicon oxide and can be formed during a chemical clean process. The formation of the gate electrode can include deposition of a gate barrier layer, deposition of a gate work function stack, and a metal fill. FIGS. 1-4 illustrate semiconductor device 100 with finFETs 102A-102B after the formation of gate structures 112. Inner spacer structures 127 can separate epitaxial fin structures 110 and gate structures 112. With inner spacer structures 127 having an essentially square (or rectangular) profile and increased effective thickness, inner spacer structures 127 can prevent electrical short between epitaxial fin structures 110 and gate structures 112.

Various embodiments in the present disclosure provide methods for forming semiconductor device 100 by a dry etching process with a fluorine-containing gas. In some embodiments, the fluorine-containing gas can include fluorine ($F_2$), hydrogen fluoride (HF), chlorine trifluoride ($ClF_3$), a fluorine radical (F*), and a nitrogen trifluoride radical ($NF_3$*). The example methods in the present disclosure can form semiconductor device 100 having fin structure 108* including fin bottom portion 108A and stacked fin portions $108B_1$* and $108B_2$* on substrate 106, as shown in FIG. 6. Stacked fin portions $108B_1$* and $108B_2$* can include semiconductor layers 120 and semiconductor layers 622. Semiconductor layers 120 can include silicon and semiconductor layers 622 can include germanium. The fluorine-containing gas can etch a portion of semiconductor layers 622 to form openings 727 shown in FIG. 7. In some embodiments, the fluorine-containing gas in the dry etching process can etch corners of the first portion of semiconductor layers 622. As a result, openings 727 can have an essentially square (or rectangular) profile, as shown in FIG. 10. Inner spacer structures 127 can be formed in openings 727 with improved profiles and thicker effective thickness shown in FIG. 16. As shown in FIGS. 3, 4, and 16, inner spacer structures 127 can include first portion 127-1 having first height 127-1h adjacent to end portions of semiconductor layers 120 and second portion 127-2 adjacent to gate structures 112 having second height 127-2h greater than first height 127-1h. First portion 127-1 of inner spacer structures 127 can have first width 127-1w and second portion 127-2 can have second width 127-2w. A ratio of first width 127-1w to a sum of first width 127-1w and second width 127-2w can be less than about 0.05. In some embodiments, using the dry etching process with fluorine-containing gases to remove first portion of semiconductor layers 622, epitaxial structure defects can be reduced from about 30%-50% to a level below about 10% and the process yield can be improved by about 10% to about 30%.

In some embodiments, a method includes forming a fin structure with a stacked fin portion on a substrate. The stacked fin portion includes a first semiconductor layer and a second semiconductor layer and the second semiconductor layer includes germanium. The method further includes etching the fin structure to form an opening and etching a portion of the second semiconductor layer with a fluorine-containing gas through the opening.

In some embodiments, a method includes forming a fin structure with a stacked fin portion on a substrate. The stacked fin portion includes a first set of semiconductor layers and a second set of semiconductor layers including germanium. The method further includes etching the fin structure to form a first opening and etching, through the first opening, a first portion of the second set of semiconductor layers with a fluorine-containing gas to form a second opening in the second set of semiconductor layers. The method further includes forming an inner spacer structure in the second opening and etching a second portion of the second set of semiconductor layers adjacent to the inner spacer structure with the fluorine-containing gas.

In some embodiments, a semiconductor device includes a fin structure with a stacked fin portion on a substrate. The stacked fin portion includes multiple semiconductor layers. The semiconductor device further includes a gate structure wrapped around a portion of the multiple semiconductor layers and an inner spacer structure adjacent to the gate structure and between a first semiconductor layer and a second semiconductor layer of the multiple semiconductor layers. The inner spacer structure includes a first portion adjacent to end portions of the multiple semiconductor layers and a second portion adjacent to the gate structure. The first portion has a first width and a first height. The second portion has a second height less than the first height and a second width. A ratio of the second width to a sum of the first and second widths is less than about 0.05.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin structure with a stacked fin portion on a substrate, wherein the stacked fin portion comprises a first semiconductor layer and a second semiconductor layer, and wherein the second semiconductor layer comprises germanium;
   forming a protective layer on top and sidewall surfaces of the fin structure;
   etching the protective layer and the fin structure to form a first opening; and
   etching, through the first opening, a portion of the second semiconductor layer with a fluorine-containing gas to form a second opening, wherein the second opening is surrounded by the protective layer, the first semiconductor layer, and the second semiconductor layer.

2. The method of claim 1, wherein the forming the fin structure comprises forming the first semiconductor layer with silicon.

3. The method of claim 1, wherein the forming the fin structure comprises forming the second semiconductor layer with silicon germanium having germanium in a range from about 40 atomic percent to about 100 atomic percent.

4. The method of claim 1, further comprising delivering the fluorine-containing gas to the fin structure at a flow rate ranging from about 1 sccm to about 500 sccm.

5. The method of claim 1, wherein the etching the portion of the second semiconductor layer comprises etching the portion of the second semiconductor layer at a temperature ranging from about −20° C. to about 350° C.

6. The method of claim 1, wherein the etching the portion of the second semiconductor layer comprises etching the portion of the second semiconductor layer under a pressure ranging from about 10 mTorr to about 10000 mTorr.

7. The method of claim 1, further comprising:
   removing the portion of the second semiconductor layer with the fluorine-containing gas at a first etch rate,
   wherein the first semiconductor layer and a gate spacer structure above the first and second semiconductor layers have a second etch rate with the fluorine-containing gas, and wherein a ratio of the first etch rate to the second etch rate ranges from about 10 to about 500.

8. The method of claim 1, wherein the fluorine-containing gas comprises at least one of fluorine, hydrogen fluoride, chlorine trifluoride, a fluorine radical, and a nitrogen trifluoride radical.

9. A method, comprising:
forming a fin structure with a stacked fin portion on a substrate, wherein the stacked fin portion comprises a first set of semiconductor layers and a second set of semiconductor layers, and wherein the second set of semiconductor layers comprise germanium;
etching the fin structure to form a first opening;
removing, through the first opening via an etching process, a first portion of the second set of semiconductor layers with a fluorine-containing gas to form a second opening in the second set of semiconductor layers, wherein:
the first portion of the second set of semiconductor layers is etched at a first etch rate during the etching process;
the first set of semiconductor layers and a gate spacer structure above the first and second set of semiconductor layers have a second etch rate with the fluorine-containing gas; and
a ratio of the first etch rate to the second etch rate ranges from about 10 to about 500;
depositing a dielectric material in the second opening to form an inner spacer structure; and
etching a second portion of the second set of semiconductor layers adjacent to dielectric material of the inner spacer structure with the fluorine-containing gas.

10. The method of claim 9, further comprising forming a gate structure wrapping around the first set of semiconductor layers.

11. The method of claim 9, wherein the forming the fin structure comprises forming the second set of semiconductor layers with silicon germanium having germanium in a range from about 40 atomic percent to about 100 atomic percent.

12. The method of claim 9, further comprising delivering the fluorine-containing gas to the fin structure at a flow rate ranging from about 1 sccm to about 500 sccm.

13. The method of claim 9, wherein the etching the first portion of the second set of semiconductor layers comprises etching the first portion of the second set of semiconductor layers at a temperature ranging from about −20° C. to about 350° C.

14. The method of claim 9, wherein the etching the first portion of the second set of semiconductor layers comprises etching the first portion of the second set of semiconductor layers under a pressure ranging from about 10 mTorr to about 10000 mTorr.

15. The method of claim 9, wherein the fluorine-containing gas comprises at least one of fluorine, hydrogen fluoride, chlorine trifluoride, a fluorine radical, and a nitrogen trifluoride radical.

16. A method, comprising:
forming a stack of semiconductor layers on a substrate, wherein the stack of semiconductor layers comprises first and second semiconductor layers stacked in an alternating configuration;
forming a protective layer on top and sidewall surfaces of the stack of semiconductor layers;
forming a first opening in the stack of semiconductor layers;
etching, through the first opening, a portion of the second semiconductor layer with a fluorine-containing gas to form a second opening; and
forming an inner spacer structure in the second opening, wherein the inner spacer structure is in contact with the protective layer, the first semiconductor layer, and the second semiconductor layer.

17. The method of claim 16, wherein the forming the stack of semiconductor layers comprises forming the first semiconductor layer with silicon.

18. The method of claim 16, wherein the forming the stack of semiconductor layers comprises forming the second semiconductor layer with silicon germanium having germanium in a range from about 40 atomic percent to about 100 atomic percent.

19. The method of claim 16, wherein the etching the portion of the second semiconductor layer comprises removing the portion of the second semiconductor layer with a dry etching process.

20. The method of claim 16, wherein the etching the portion of the second semiconductor layer comprises forming the second opening with a square profile.

* * * * *